(12) United States Patent
Kwon

(10) Patent No.: US 11,120,876 B2
(45) Date of Patent: Sep. 14, 2021

(54) SEMICONDUCTOR MEMORY DEVICE

(71) Applicant: SK hynix Inc., Icheon-si (KR)

(72) Inventor: Tae Heui Kwon, Seoul (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 16/802,195

(22) Filed: Feb. 26, 2020

(65) Prior Publication Data

US 2021/0020248 A1   Jan. 21, 2021

(30) Foreign Application Priority Data

Jul. 19, 2019   (KR) .......................... 10-2019-0087880

(51) Int. Cl.
| | | |
|---|---|---|
| G11C 11/34 | (2006.01) | |
| G11C 16/04 | (2006.01) | |
| G11C 16/26 | (2006.01) | |
| G11C 16/24 | (2006.01) | |
| H01L 27/11582 | (2017.01) | |
| H01L 27/11556 | (2017.01) | |

(52) U.S. Cl.
CPC .......... *G11C 16/0483* (2013.01); *G11C 16/24* (2013.01); *G11C 16/26* (2013.01); *H01L 27/11556* (2013.01); *H01L 27/11582* (2013.01)

(58) Field of Classification Search
CPC ..... G11C 16/0483; G11C 16/26; G11C 16/24; H01L 27/11582; H01L 27/11556
USPC ...................................................... 365/185.12
See application file for complete search history.

(56) References Cited

U.S. PATENT DOCUMENTS

| | | | | |
|---|---|---|---|---|
| 7,421,557 B2 * | 9/2008 | Lee | ...................... | G11C 7/1039 711/167 |
| 2015/0200015 A1 * | 7/2015 | Kim | ...................... | G11C 7/1042 365/185.12 |

FOREIGN PATENT DOCUMENTS

| | | |
|---|---|---|
| KR | 100434512 B1 | 6/2004 |
| KR | 1020170069010 A | 6/2017 |

* cited by examiner

*Primary Examiner* — Hoai V Ho
*Assistant Examiner* — Minh Dinh
(74) *Attorney, Agent, or Firm* — William Park & Associates Ltd.

(57) ABSTRACT

A semiconductor memory device includes: a memory cell for storing data; a page buffer connected to the memory cell through a bit line, to store data in the memory cell or read data from the memory cell; and a cache latch connected to the page buffer through a bus node. When bit data transmission operation between the page buffer and the cache latch is performed, the bus node is discharged before starting the bit data transmission operation.

18 Claims, 19 Drawing Sheets

SEMICONDUCTOR MEMORY DEVICE

CROSS-REFERENCE TO RELATED APPLICATION

The present application claims priority under 35 U.S.C. § 119(a) to Korean patent application number 10-2019-0087880, filed on Jul. 19, 2019, in the Korean Intellectual Property Office, the entire disclosure of which is incorporated herein by reference.

BACKGROUND

1. Technical Field

The present disclosure generally relates to an electronic device, and more particularly, to a semiconductor memory device.

2. Related Art

Memory devices may be formed in a two-dimensional structure in which strings are arranged horizontally to a semiconductor substrate, or be formed in a three-dimensional structure in which strings are arranged vertically to a semiconductor substrate. A three-dimensional memory device is a memory device devised to overcome the limit of degree of integration in two-dimensional memory devices, and may include a plurality of memory cells vertically stacked on a semiconductor substrate.

SUMMARY

In accordance with an aspect of the present disclosure, there may be provided a semiconductor memory device including: a memory cell configured to store data; at least one page buffer connected to the memory cell through a bit line, to store data in the memory cell or read data from the memory cell; and at least one cache latch connected to the at least one page buffer through a bus node, wherein, when bit data transmission operation between the at least one page buffer and the at least one cache latch is performed, the bus node is discharged before starting the bit data transmission operation.

In accordance with another aspect of the present disclosure, there may be provided a semiconductor memory device including: a page buffer including a main latch; and a cache latch connected to the page buffer through a bus node, wherein, when bit data transmission operation between the main latch and the cache latch is performed, the bus node is discharged to a voltage denoting a logic value of 0 before starting the bit data transmission operation.

In accordance with another aspect of the present disclosure, there may be provided a semiconductor memory device including: a memory cell configured to store data; at least one page buffer connected to the memory cell through a bit line, to store data in the memory cell or read data from the memory cell; at least one cache latch connected to the at least one page buffer through a bus node; and a bus node setting component coupled to the bus node. The bus node setting component is configured to discharge the bus node before data is transmitted through the bus node and between the at least one page buffer and the at least one cache latch.

In accordance with another aspect of the present disclosure, there may be provided a semiconductor memory device including: at least one page buffer including a main latch; at least one cache latch connected to the page buffer through a bus node; and a bus node setting component coupled to the bus node. The bus node setting component is configured to discharge the bus node before data is transmitted through the bus node and between the at least one page buffer and the at least one cache latch.

BRIEF DESCRIPTION OF THE DRAWINGS

Examples of embodiments will now be described hereinafter with reference to the accompanying drawings; however, they may be embodied in different forms and should not be construed as limited to the embodiments set forth herein. Rather, these embodiments are provided so that this disclosure will be thorough and complete, and will convey the scope of the examples of embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

DETAILED DESCRIPTION

Figure 1:
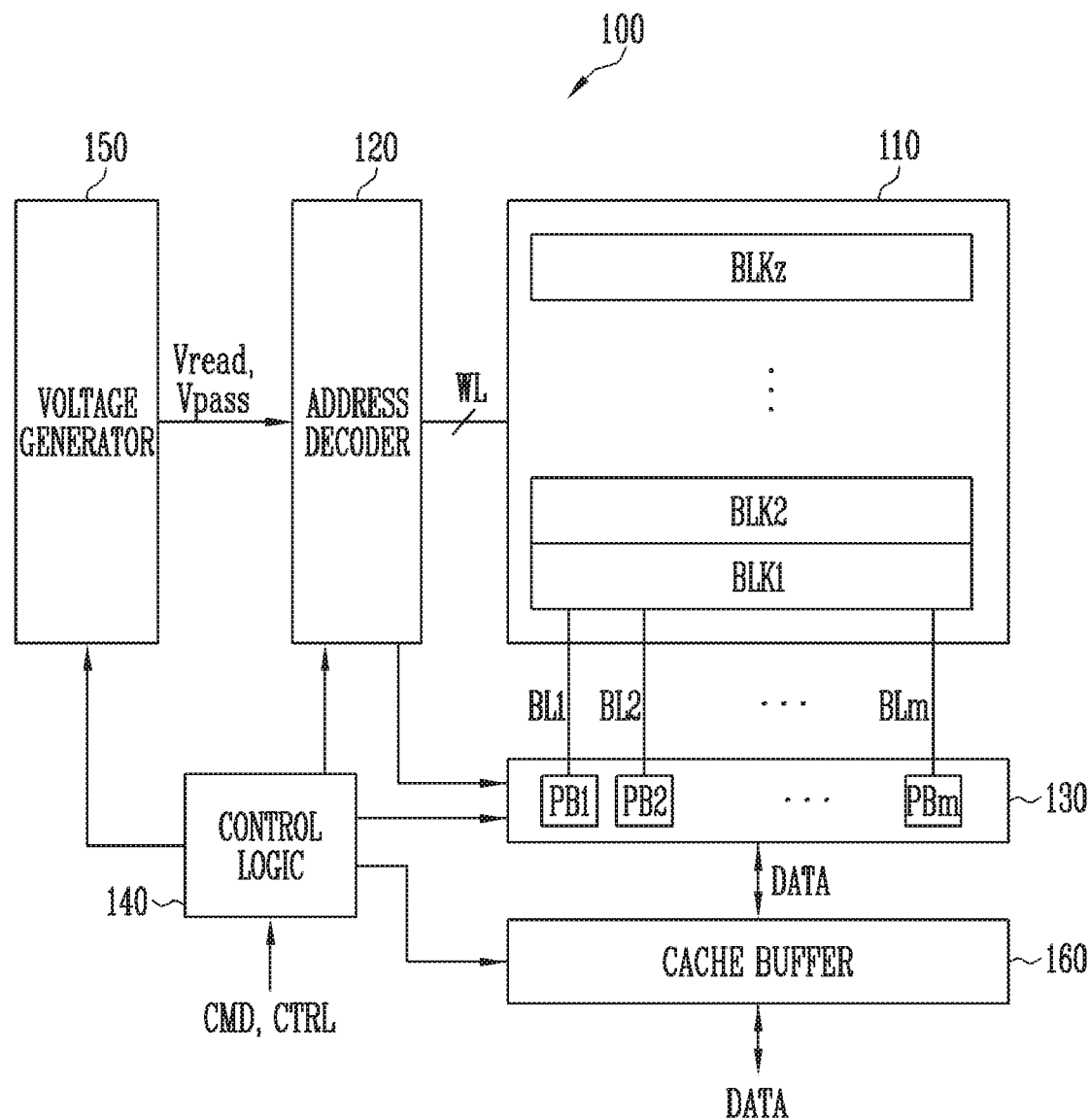
FIG. 1 is a block diagram illustrating a semiconductor memory device in accordance with an embodiment of the present disclosure.

In the present disclosure, advantages, features and methods for achieving them will become more apparent after a reading of the following examples of embodiments taken in conjunction with the drawings. The present disclosure may, however, be embodied in different forms and should not be construed as being limited to the embodiments set forth herein. Rather, these embodiments are provided to describe the present disclosure to the extent that those skilled in the art to which the disclosure pertains may enforce the technical concept of the present disclosure.

In the entire specification, when an element is referred to as being "connected" or "coupled" to another element, it can be directly connected or coupled to the another element or be indirectly connected or coupled to the another element with one or more intervening elements interposed therebetween. In addition, when an element is referred to as "including" a component, this indicates that the element may further include another component instead of excluding another component unless there is different disclosure.

Hereinafter, examples of embodiments of the present disclosure will be described with reference to the accompanying drawings. The same reference numerals are used to designate the same elements as those shown in other drawings. In the following descriptions, only portions necessary for understanding operations in accordance with the examples of embodiments may be described, and descriptions of the other portions may be omitted to not obscure concepts of the embodiments.

Embodiments provide a semiconductor memory device capable of decreasing a peak current.

FIG. 1 is a block diagram illustrating a semiconductor memory device in accordance with an embodiment of the present disclosure.

Referring to FIG. 1, the semiconductor memory device 100 includes a memory cell array 110, an address decoder 120, a read/write circuit 130, control logic 140, a voltage generator 150, and a cache buffer 160. The control logic 140 may be implemented as hardware, software, or a combination of hardware and software. For example, the control logic 140 may be a control logic circuit operating in accordance with an algorithm and/or a processor executing control logic code.

The memory cell array 110 includes a plurality of memory blocks BLK1 to BLKz. The plurality of memory blocks BLK1 to BLKz are connected to the address decoder 120 through word lines WL. The plurality of memory blocks BLK1 to BLKz are connected to the read/write circuit 130 through bit lines BL1 to BLm. Each of the plurality of memory blocks BLK1 to BLKz includes a plurality of memory cells. In an embodiment, the plurality of memory cells may be nonvolatile memory cells, and be configured with nonvolatile memory cells having a vertical channel structure. The memory cell array 110 may be configured as a memory cell array having a two-dimensional structure. In some embodiments, the memory cell array 110 may be configured as a memory cell array having a three-dimensional structure. In accordance with an embodiment of the present disclosure, each of the plurality of memory blocks BLK1 to BLKz included in the memory cell array 110 may include a plurality of sub-blocks. In an example, each of the plurality of memory blocks BLK1 to BLKz may include two sub-blocks. In another example, each of the plurality of memory blocks BLK1 to BLKz may include four sub-blocks. In accordance with a semiconductor memory device and an operating method thereof in accordance with an embodiment of the present disclosure, sub-blocks included in memory blocks are not limited thereto, and various numbers of sub-blocks may be included in each of the memory blocks. Each of the plurality of memory cells included in the memory cell array may store at least 1-bit data. In an embodiment, each of plurality of the memory cells included in the memory cell array 110 may be a single-level cell (SLC) storing 1-bit data. In another embodiment, each of the plurality of memory cells included in the memory cell array 110 may be a multi-level cell (MLC) storing 2-bit data. In still another embodiment, each of the plurality of memory cells included in the memory cell array 110 may be a triple-level cell (TLC) storing 3-bit data. In still another embodiment, each of the plurality of memory cells included in the memory cell array 110 may be a quadruple-level cell (QLC) storing 4-bit data. In some embodiments, the memory cell array 110 may include a plurality of memory cells each storing 5-or-more bit data.

The address decoder 120, the read/write circuit 130, and the voltage generator 150 operate as a peripheral circuit for driving the memory cell array 110. The address decoder 120 is connected to the memory cell array 110 through the word lines WL. The address decoder 120 operates under the control of the control logic 140.

The address decoder 120 decodes a block address among received addresses. The address decoder 120 selects at least one memory block according to the decoded block address. Also, in a read voltage application operation during a read operation, the address decoder 120 applies a read voltage dread generated by the voltage generator 150 to a selected word line of the selected memory block, and applies a pass voltage Vpass generated by the voltage generator 150 to the other unselected word lines. Also, in a program verify operation, the address decoder 120 applies a verify voltage generated by the voltage generator 150 to the selected word line of the selected memory block, and applies the pass voltage Vpass to the other unselected word lines.

The address decoder 120 decodes a column address among the received addresses. The address decoder 120 transmits the decoded column address to the read/write circuit 130.

Read and program operations of the semiconductor memory device 100 are performed in units of pages. Addresses received in a request for the read and program operations include a block address, a row address, and a column address. The address decoder 120 selects one memory block and one word line according to the block address and the row address. The column address is decoded by the address decoder 120 to be provided to the read/write circuit 130.

The address decoder 120 may include a block decoder, a row decoder, a column decoder, an address buffer, and the like.

The read/write circuit 130 includes a plurality of page buffers PB1 to PBm. The read/write circuit 130 may operate as a "read circuit" in a read operation, and operate as a "write circuit" in a write operation. The plurality of page buffers PB1 to PBm are connected to the memory cell array 110 through the bit lines BL1 to BLm. In order to sense threshold voltages of the memory cells in a read operation or a program verify operation, the plurality of page buffers PB1 to PBm supply sensing current to the bit lines connected to the memory cells, and each page buffer senses, through a sensing node, a change in amount of current flowing depending on a program state of a corresponding memory cell and then latches the sensed change as sensing data. The read/write circuit 130 operates in response to page buffer control signals output from the control logic 140.

In a read operation, the read/write circuit 130 senses data of the memory cells and temporarily stores read data, and then outputs data DATA to the cache buffer 160. In an example of an embodiment, the read/write circuit 130 may include a column select circuit and the like as well as the page buffers (or page registers).

The control logic 140 is connected to the address decoder 120, the read/write circuit 130, the cache buffer 160, and the voltage generator 130. The control logic 140 receives a command CMD and a control signal CTRL. The control logic 140 controls overall operations of the semiconductor memory device 100 in response to the control signal CTRL. Also, the control logic 140 outputs a control signal for controlling node precharge potential levels of the plurality of page buffers PB1 to PBm. The control logic 140 may control the read/write circuit 130 to perform a read operation of the memory cell array 110. The control logic 140 may control data exchange between the read/write circuit 130 and the cache buffer 160.

The voltage generator 150 generates a read voltage dread and a pass voltage Vpass in a read operation in response to a voltage generator control signal output from the control logic 140.

The cache buffer 160 may receive data DATA from the outside of the semiconductor memory device 100 and temporarily store the data DATA, and then transmit the data DATA to the read/write circuit 130. In an embodiment, the cache buffer 160 may receive data DATA for a program operation from a controller at the outside of the semiconductor memory device 100, and transmit the received data DATA to the read/write circuit 130. The read/write circuit 130 may program the data DATA received from the cache buffer 160 in selected memory cells of the memory cell array 110.

The cache buffer 160 may temporarily store data DATA transmitted from the read/write circuit 130 and then transmit the data DATA to the outside of the semiconductor memory device 100. In an embodiment, the read/write circuit 130 may read data DATA stored in selected memory cells of the memory cell array 110. The data DATA read from the read/write circuit 130 may be temporarily stored in the cache buffer 160. The cache buffer 160 may transmit the read data transmitted from the read/write circuit 130 to the controller.

In accordance with a semiconductor memory device in accordance with an embodiment of the present disclosure, the voltage of a bus node PBUS swings between a voltage lower than a power voltage V1 and 0 V under a situation in the bus node PBUS is not precharged but discharged in data transmission between a main latch and a cache latch. Accordingly, a peak current consumed in the data transmission between the main latch and the cache latch can be decreased.

Figure 2:
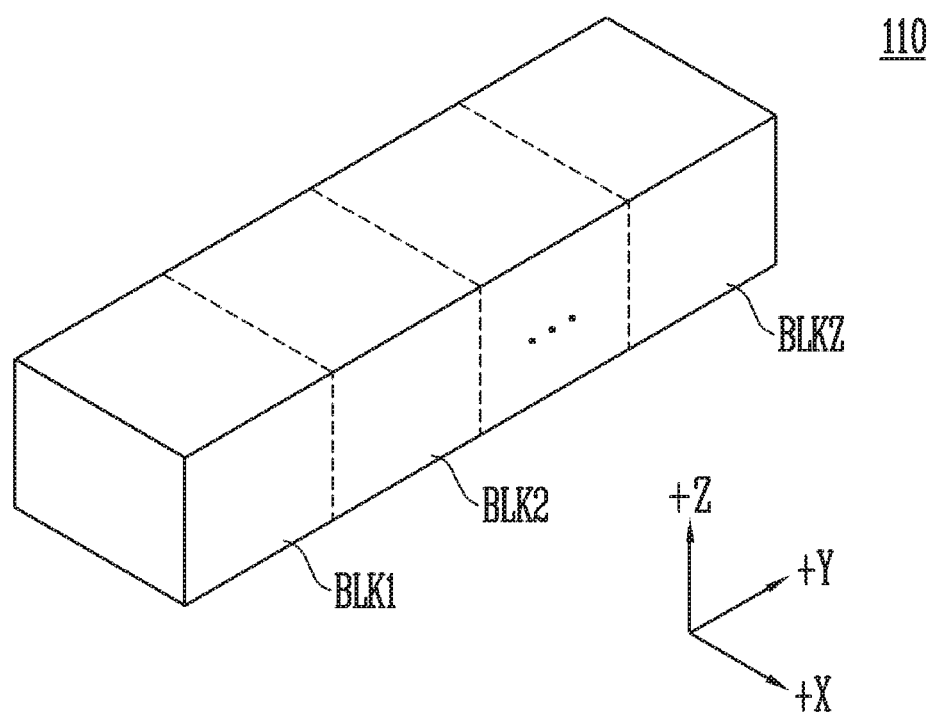
FIG. 2 is a block diagram illustrating an embodiment of a memory cell array shown in FIG. 1.

FIG. 2 is a block diagram illustrating an embodiment of the memory cell array 110 shown in FIG. 1.

Referring to FIG. 2, the memory cell array 110 may include a plurality of memory blocks BLK1 to BLKz. Each memory block may have a three-dimensional structure. Each memory block may include a plurality of memory cells stacked on a substrate (not shown). The plurality of memory cells may be arranged along +X, +Y, and +Z directions. A structure of each memory block will be described with reference to FIGS. 3 and 4.

Figure 3:
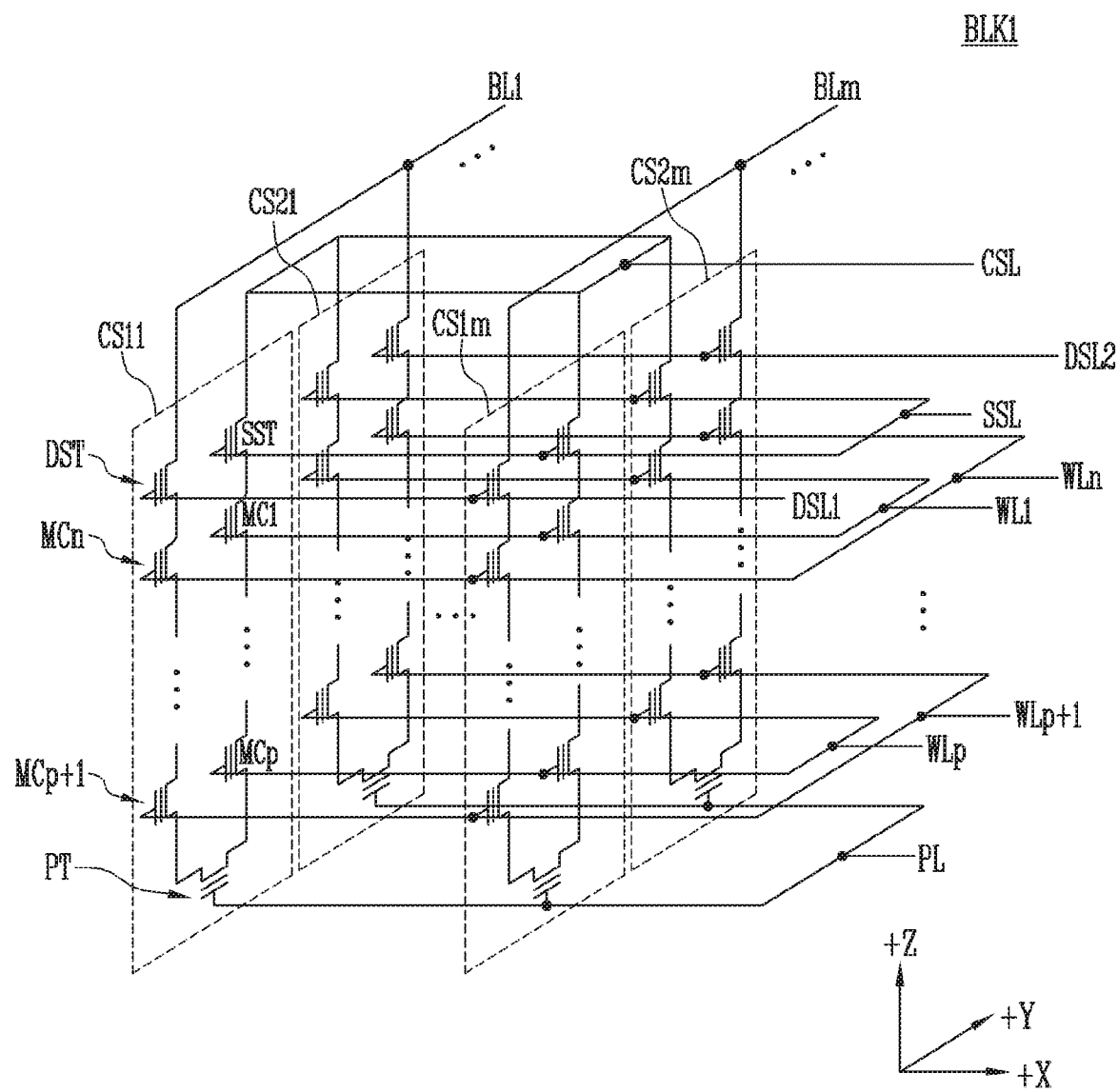
FIG. 3 is a circuit diagram illustrating any one memory block among memory blocks shown in FIG. 2.

FIG. 3 is a circuit diagram illustrating any one memory block BLK1 among the memory blocks BLK1 to BLKz shown in FIG. 2.

Referring to FIG. 3, a first memory block BLK1 includes a plurality of cell strings CS11 to CS1$m$ and CS21 to CS2$m$. In the first memory block BLK1, m cell strings are arranged in a row direction (i.e., a +X direction). The m cell strings arranged in the row direction are respectively connected to first to mth bit lines BL1 to BLm. q (q is a natural number) cell strings are arranged in a column direction (i.e., a +Y direction). For convenience of description, only two strings arranged in the column direction are illustrated in FIG. 3.

Each of the plurality of cell strings CS11 to CS1$m$ and CS21 to CS2$m$ is formed in a 'U' shape. Each of the plurality of cell strings CS11 to CS1$m$ and CS21 to CS2$m$ includes a pipe transistor PT, memory cells MC1 to MCn, a source select transistor SST, and a drain select transistor DST, which are stacked above a substrate (not shown) under the memory block BLK1.

The select transistors SST and DST and the memory cells MC1 to MCn may have structures similar to one another. For example, each of the select transistors SST and DST and the memory cells MC1 to MCn may include a channel layer, a tunneling insulating layer, a charge storage layer, and a blocking insulating layer connected to a corresponding row line.

The source select transistor SST of each cell string is connected between a common source line CSL and the memory cells MC1 to MCp. A gate of the source select transistor SST is commonly connected to a source select line SSL.

First to nth memory cells MC1 to MCn of each cell string are connected between the source select transistor SST and the drain select transistor DST.

The first to nth memory cells MC1 to MCn are divided into first to pth memory cells MC1 to MCp and a (p+1)th to nth memory cells MCp+1 to MCn. The first to pth memory cells MC1 to MCp and the (p+1)th to nth memory cells MCp+1 to MCn are connected through the pipe transistor PT. The first to pth memory cells MC1 to MCp are sequentially arranged in the opposite direction of a +Z direction, and are connected in series between the source select transistor SST and the pipe transistor PT. The (p+1)th to nth memory cells MCp+1 to MCn are sequentially arranged in the +Z direction, and are connected in series between the pipe transistor PT and the drain select transistor DST. Gates of the first to nth memory cells MC1 to MCn are respectively connected to first to nth word lines WL1 to WLn.

A gate of the pipe transistor PT of each cell string is connected to a pipe line PL.

The drain select transistor DST of each cell string is connected between a corresponding bit line and the memory cells MCp+1 to MCn. The drain select transistors DST of the cell strings CS11 to CS1$m$ on a first row are connected to a first drain select line DSL1. The drain select transistors DST of the cell strings CS21 to CS2$m$ on a second row are connected to a second drain select line DSL2.

Consequently, cell strings (e.g., CS11 to CS1$m$) arranged on the same row (+X direction) are connected to the same drain select line e.g., DSL1) through corresponding drain select transistors. Cell strings (e.g., CS11 and CS21) arranged on different rows are connected to different drain select lines DSL1 and DSL2.

Figure 4:
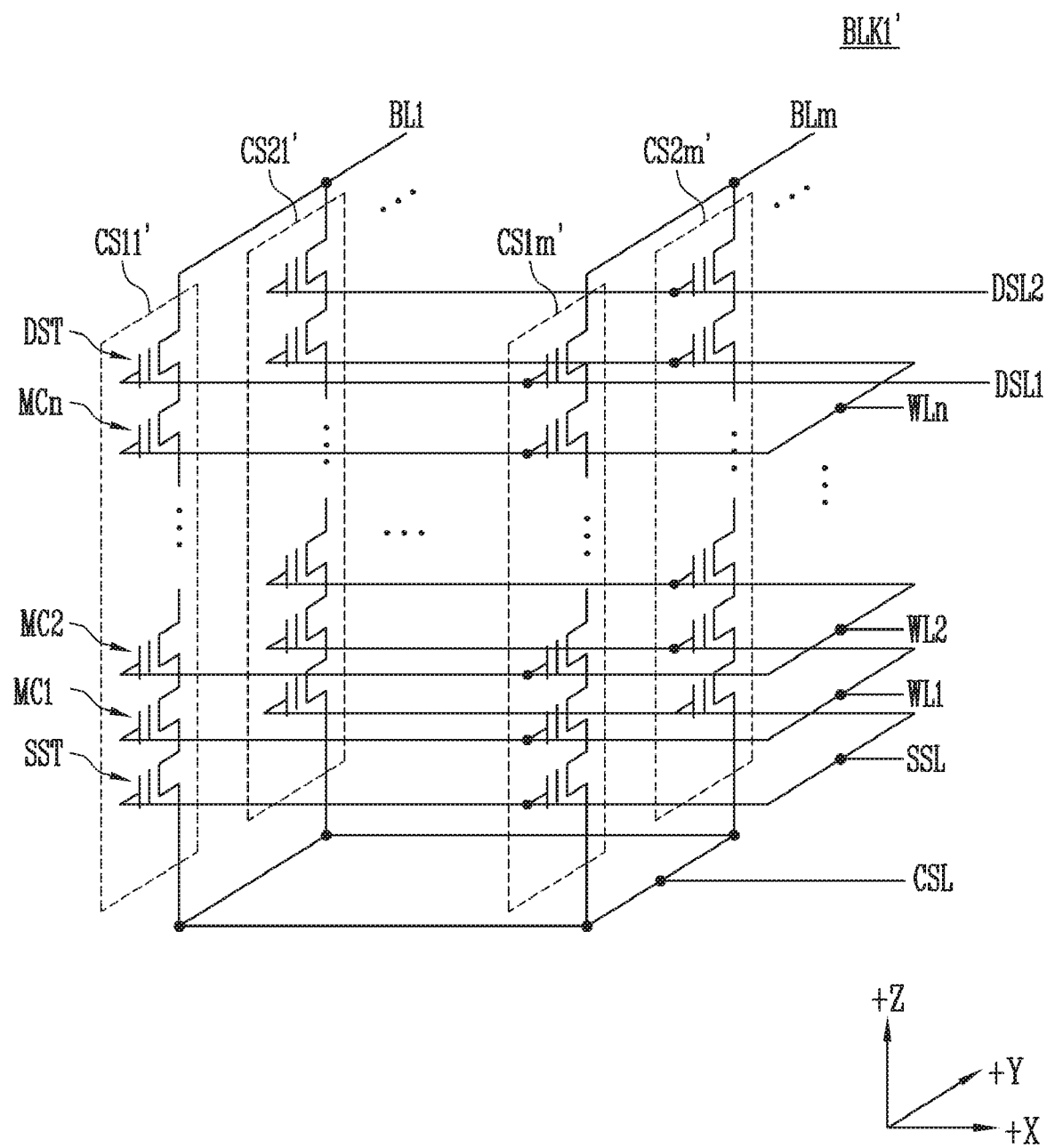
FIG. 4 is a circuit diagram illustrating another embodiment of the one memory block among the memory blocks shown in FIG. 2.

FIG. 4 is a circuit diagram illustrating another embodiment BLK1' of the one memory block BLK1 among the memory blocks BLK1 to BLKz shown in FIG. 2.

Referring to FIG. 4, a first memory block BLK1' includes a plurality of cell strings CS11' to CS1m' and CS21' to CS2m'. In the first memory block BLK1', m cell strings are arranged in a row direction (i.e., +X direction). The m cell strings arranged in the row direction are respectively connected to first to mth bit lines BL1 to BLm. q (q is a natural number) cell strings are arranged in a column direction (i.e., a +Y direction). For convenience of description, only two strings arranged in the column direction are illustrated in FIG. 4.

Each of the plurality of cell strings CS11' to CS1m' and CS21' to CS2m' extend along a +Z direction. Each of the plurality of cell strings CS11' to CS1m' and CS21' to CS2m' includes a source select transistor SST, first to nth memory cells MC1 to MCn, and a drain select transistor DST, which are stacked above a substrate (not shown) under the memory block BLK1'.

The source select transistor SST of each cell string is connected to a common source line CSL. The source select transistor SST of each cell string is connected between the common source line CSL and the memory cells MC1 to MCn. A gate of the source select transistor SST of each cell string is connected to a source select line SSL.

The first to nth memory cells MC1 to MCn of each cell string are connected in series between the source select transistor SST and the drain select transistor DST. Memory cells at the same height are connected to the same word line. The first to nth memory cells MC1 to MCn are respectively connected to first to nth word lines WL1 to WLn.

The drain select transistor DST of each cell string is connected between a corresponding bit line and the memory cells MC1 to MCn. The drain select transistors DST of cell strings arranged on the same row (+X direction) are connected to the same drain select line. The drain select transistors DST of cell strings CS11' to CS1m' on a first row are connected to a first drain select line DSL1. The drain select transistors DST of cell strings CS21' to CS2m' on a second row are connected to a second drain select line DSL2.

Consequently, the memory block BLK1' shown in FIG. 4 has a circuit similar to that of the memory block BLK1 shown in FIG. 3, except that the pipe transistor PT is excluded from each cell string shown in FIG. 4.

In FIG. 4, first to mth strings CS11' to CS1m' or CS21' to CS2m' arranged in the row direction are respectively connected to the first to mth bit lines BL1 to BLm. In another embodiment, even bit lines and odd bit lines may be provided instead of the first to mth bit lines BL1 to BLm. In addition, it will be understood that even-numbered cell strings among the cell strings CS11' to CS1m' or CS21' to CS2m' arranged in the row direction may be respectively connected to the even bit lines, and odd-numbered cell strings among the cell strings CS11' to CS1m' or CS21' to CS2m' arranged in the row direction may be respectively connected to the odd bit lines.

Figure 5:
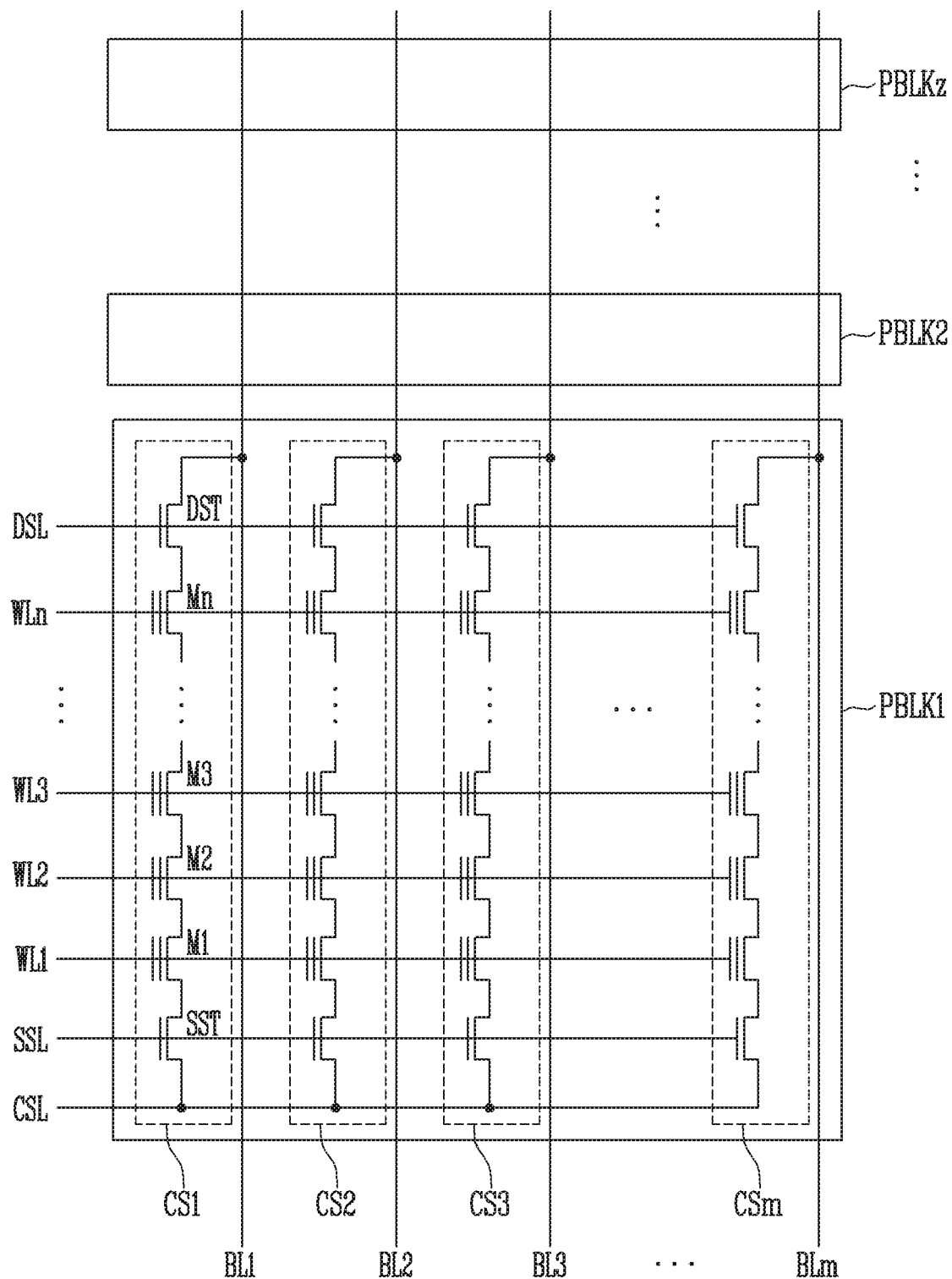
FIG. 5 is a block diagram illustrating another embodiment of the memory cell array shown in FIG. 1.

FIG. 5 is a block diagram illustrating another embodiment of the memory cell array 110 shown in FIG. 1.

The technical concept of the present disclosure may be applied to a case where memory cells are two-dimensionally arranged. Referring to FIG. 5, a memory cell array includes a plurality of planar memory blocks PBLK1 to PBLKz. Each of the plurality of planar memory blocks PBLK1 to PBLKz includes first to mth cell strings CS1 to CSm. The first to mth cell strings CS1 to CSm are respectively connected to first to mth bit lines BL1 to BLm.

Each of the cell strings CS1 to CSm includes a source select transistor SST, a plurality of memory cells M1 to Mn connected in series, and a drain select transistor DST. The source select transistor SST is connected to a source select line SSL. First to nth memory cells M1 to Mn are respectively connected to first to nth word lines WL1 to WLn. The drain select transistor DST is connected to a drain select line DSL. A source side of the source select transistor SST is connected to a common source line CSL. A drain side of the drain select transistor DST is connected to a corresponding bit line. The source select line SSL, the first to nth word lines WL1 to WLn, and the drain select line DSL are driven by the address decoder 120.

In an embodiment, each of the memory cells may be a nonvolatile memory cell.

Figure 6:
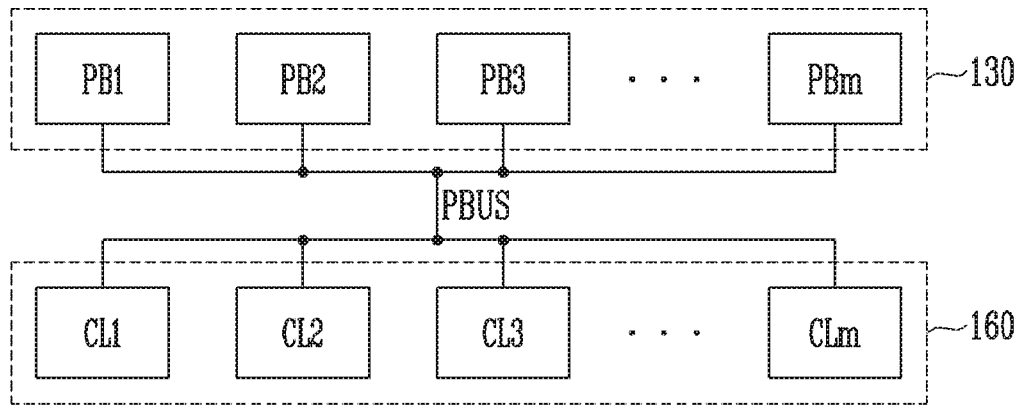
FIG. 6 is a block diagram which illustrates a connection relationship between a read/write circuit and a cache buffer, which are shown in FIG. 1.

FIG. 6 is a block diagram which illustrates a connection relationship between the read/write circuit 130 and the cache buffer 160, which are shown in FIG. 1.

Referring to FIG. 6, the read/write circuit 130 may include a plurality of page buffers PB1 to PBm. The cache buffer 160 may include a plurality of cache latches CL1 to CLm. In an embodiment, the plurality of cache latches CL1 to CLm may correspond one-to-one to the plurality of page buffers PB1 to PBm, respectively. In an example, the cache latch CL1 may store bit data to be transmitted to the page buffer PB1. Also, the cache latch CL1 may store bit data received from the page buffer PB1. In another example, the cache latch CL2 may store bit data to be transmitted to the page buffer PB2. Also, the cache latch CL2 may store bit data received from the page buffer PB2.

The page buffers PB1 to PBm included in the read/write circuit 130 may be connected one-to-one to the cache latches CL1 to CLm included in the cache buffer 160. However, in an embodiment, the page buffers PB1 to PBm included in the read/write circuit 130 may be connected in a bus structure to the cache latches CL1 to CLm included in the cache buffer 160 as shown in FIG. 6. Therefore, the page buffers PB1 to PBm may be respectively connected to corresponding cache latches CL1 to CLm through a bus node PBUS. That is, the page buffers PB1 to PBm are respectively connected to the corresponding cache latches CL1 to CLm by sharing the bus node PBUS. Accordingly, while bit data is being transmitted between a specific page buffer (e.g., PB1) and a cache latch (e.g., CL1) corresponding thereto, the bit data might not be transmitted between the other page buffers (e.g., PB2 to PBm) and cache latches (e.g., CL2 to CLm) respectively corresponding thereto.

In FIG. 6, a case where all the page buffers PB1 to PBm included in the read/write circuit 130 are connected to the corresponding cache latches CL1 to CLm through one bus is illustrated. However, the page buffers PB1 to PBm may be connected to the corresponding cache latches CL1 to CLm through a plurality of buses.

Figure 7:
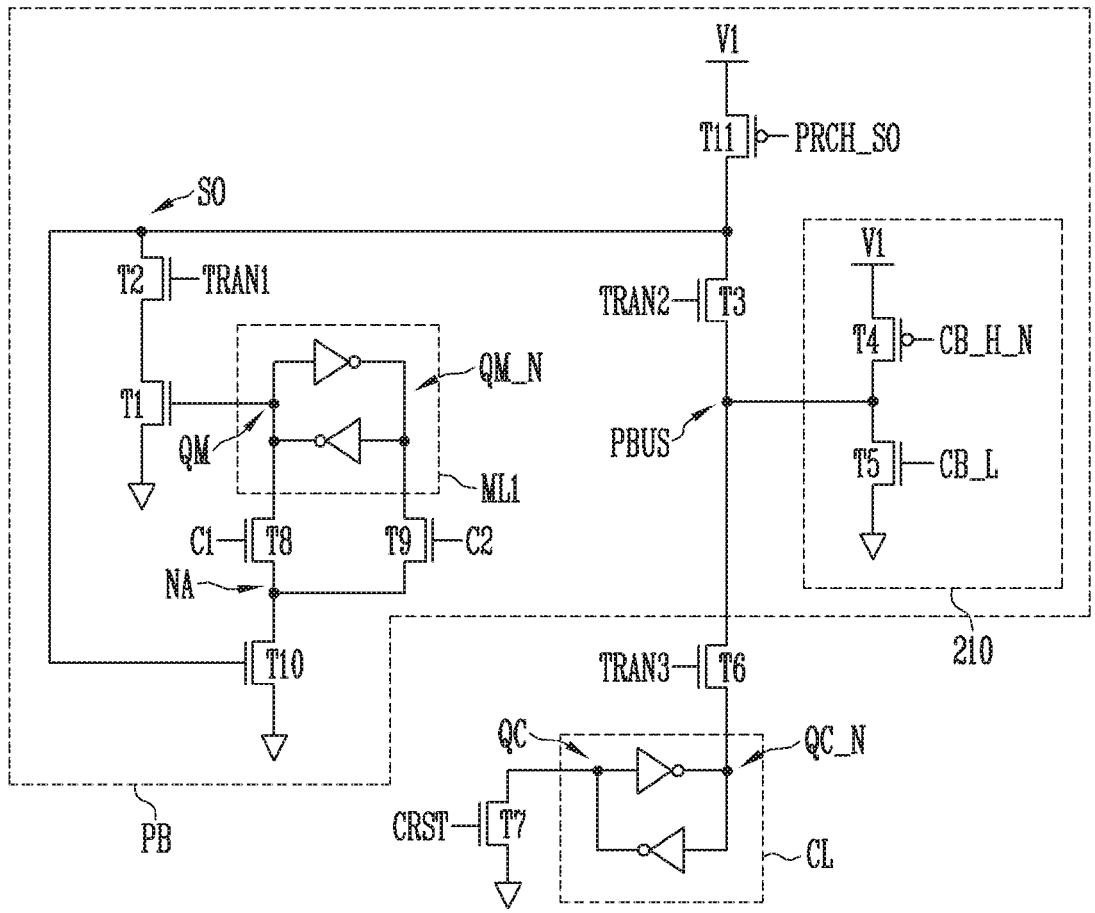
FIG. 7 is a circuit diagram illustrating a structure of a page buffer and a cache latch connected thereto in accordance with an embodiment of the present disclosure.

FIG. 7 is a circuit diagram illustrating a structure of a page buffer PB and a cache latch CL connected thereto in accordance with an embodiment of the present disclosure. In FIG. 7, illustration of a connection relationship between the page buffer PB and a bit line corresponding thereto will be omitted.

Referring to FIG. 7, the page buffer PB includes a main latch ML1, a latch transistor T1, a first transmission transistor T2, a first latch control transistor T8, a second latch control transistor T9, a second transmission transistor T3, a latch transmission transistor T10, an SO precharge transistor T11, and a bus node setting component 210. The bus node setting component 210 includes a bus node precharge transistor T4 and a bus node discharge transistor T5. The page buffer PB is connected to the cache latch CL through a third transmission transistor T6. A cache reset transistor T7 is connected between a node QC of the cache latch CL and a ground.

A gate terminal of the latch transistor T1 is connected to a node QM of the main latch ML1. The latch transistor T1 is connected between the first transmission transistor T2 and the ground. The first transmission transistor T2 is connected between a node SO and the latch transistor T1. The second transmission transistor T3 is connected between the node SO and a bus node PBUS. The first latch control transistor T8 is connected between the node QM of the main latch ML1 and a node NA. The second latch control transistor T9 is connected between a node QM_N of the main latch ML1 and the node NA. The latch transmission transistor T10 is connected between the node NA and the ground. Also, a gate terminal of the latch transmission transistor T10 is connected to the node SO. In the embodiments shown in FIG. 7, the SO precharge transistor T11 and the bus node precharge transistor T4 may be implemented with a PMOS transistor, and the other transistors may be implemented with an NMOS transistor.

A first transmission control signal TRAN1, a second transmission control signal TRAN2, and a third transmission control signal TRAN3 are respectively applied to gate terminals of the first transmission transistor T2, the second transmission transistor T3, and the third transmission transistor 16. A first latch control signal C1 and a second latch control signal C2 are respectively applied to the first latch control transistor T8 and the second latch control transistor T9. An SO precharge control signal PRCH_SO, a bus node precharge control signal CB_H_N, and a bus node discharge control signal CL_L are respectively applied to gate terminals of the SO precharge transistor T11, the bus node precharge transistor T4, and the bus node discharge transistor T5. A cache reset control signal CRST is applied to a gate terminal of the cache reset transistor T7.

The SO precharge transistor T11 is connected between a power voltage V1 and the node SO. The bus node precharge transistor T4 is connected between the power voltage V1 and the bus node PBUS. The bus node discharge transistor T5 is connected between the bus node PBUS and the ground.

In FIG. 7, a case where the bus node setting component 210 is included in the page buffer PB is illustrated. Therefore, each of the plurality of page buffers PB1 to PBm may include a bus node setting component. However, since the bus node PBUS is commonly connected to the plurality of page buffers PB1 to PBm, only one bus node setting component 210 may be connected for each bus node PBUS, without being included in each of the page buffers.

Through the circuit shown in FIG. 7, bit data stored in the main latch ML1 of the page buffer PB may be transmitted to the cache latch CL, and bit data stored in the cache latch CL may be transmitted to the main latch ML1. Data transmission method between the main latch ML1 and the cache latch CL will be described later with reference to FIGS. 8A, 8B, 9A, and 9B.

Figure 8A:
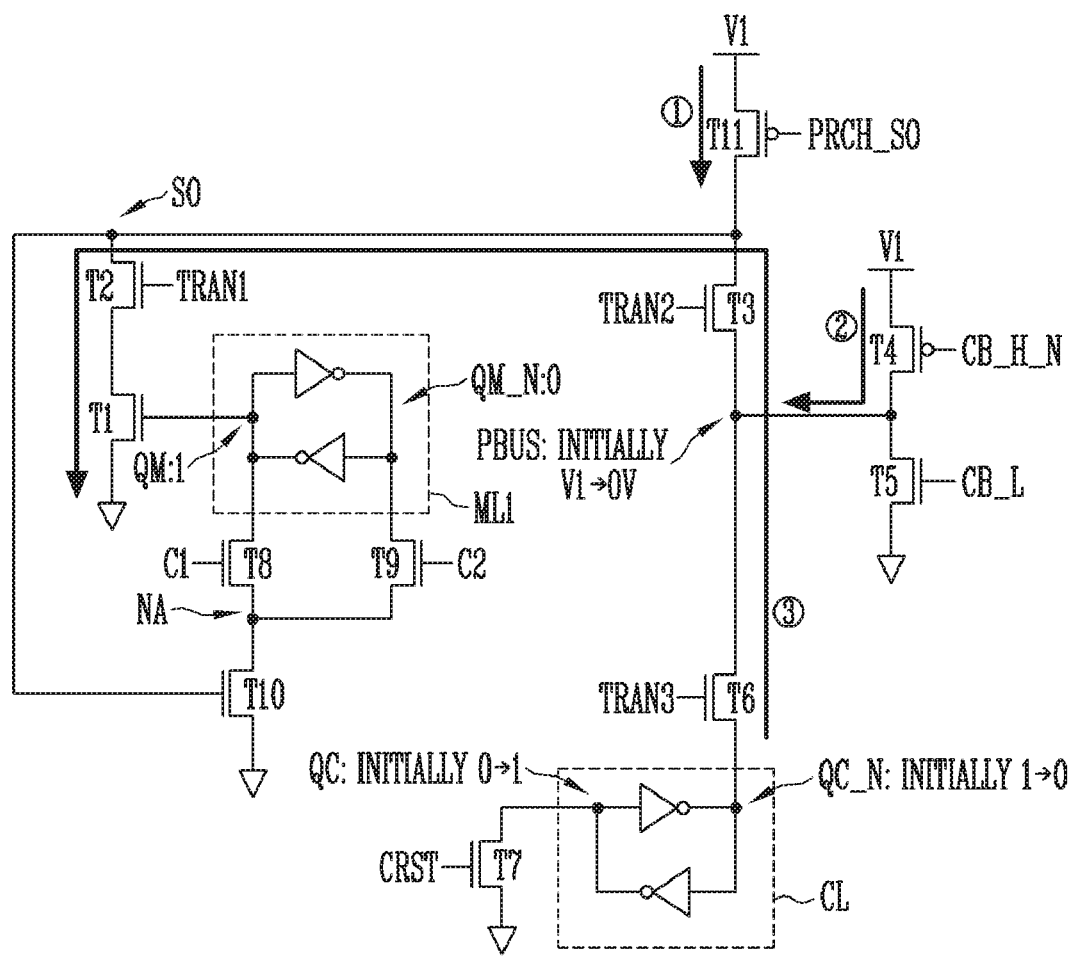
FIGS. 8A and 8B are diagrams illustrating a method in which data of a main latch shown in FIG. 7 is transmitted to the cache latch.
Figure 8B:
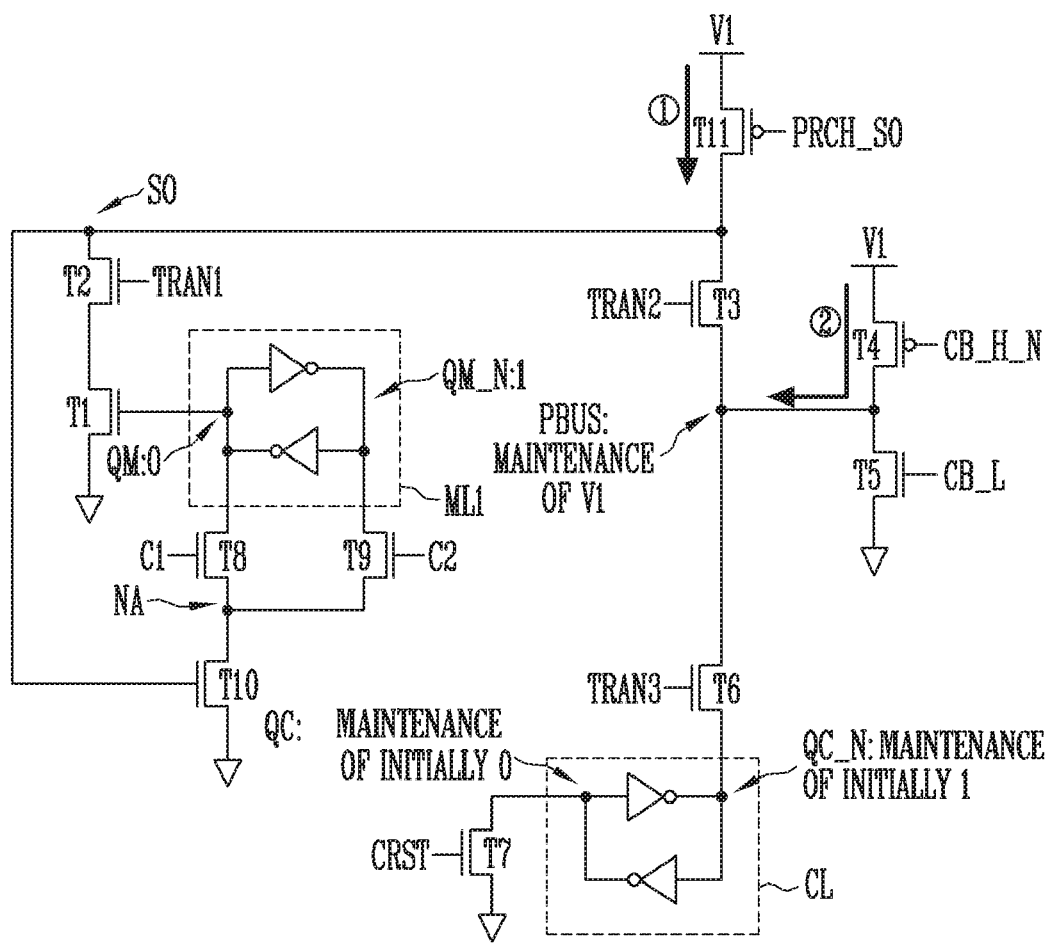

FIGS. 8A and 8B are diagrams illustrating a method in which data of the main latch shown in FIG. 7 is transmitted to the cache latch.

First, FIG. 8A illustrates a case where bit data of "1" is stored in the main latch ML1. Initially, the cache reset control signal CRST is activated to a high level, so that the initial logic value of the node QC of the cache latch CL becomes 0 and the initial logic value of the node QC_N of the cache latch CL becomes 1. In this specification, that the logic value of a specific node is "0" means that the voltage of a corresponding node becomes a low level or 0 V, and that the logic value of the specific node is "1" means that the voltage of the corresponding node becomes the high level.

First, the SO precharge control signal PRCH_SO is activated to the low level, so that the SO precharge transistor T11 is turned on. Accordingly, the node SO is precharged by the power voltage V1 (①). Subsequently, the bus node precharge control signal CB_H_N is activated to the low level, so that the bus node PBUS is precharged to the power voltage V1 (②).

Since the node QM of the main latch ML1 has a logic value of "1," the latch transistor T1 is turned on. In this state, the first transmission control signal TRAN1, the second transmission control signal TRAN2, and the third transmission control signal TRAN3 are all activated to the high level, so that the first transmission transistor T2, the second transmission transistor T3, and the third transmission transistor T6 are turned on. Since the latch transistor T1 is turned on, a current path is formed from the bus node PBUS and the node SO to the ground. Therefore, the voltage precharged in the bus node PBUS and the node SO is decreased to 0 V (③). Accordingly, the logic value of the node QC_N of the cache latch CL is changed from initially 1 to 0, and the logic value of the node QC of the cache latch CL is also changed from initially 0 to 1, Finally, the value of bit data stored in the cache latch CL becomes "1" as the logic value of the node QC. For various presented embodiments, the low logic level corresponds to 0 V. Specifically, a voltage denoting the low logic level may be ground voltage. However, in other embodiments, the low logic level may correspond to a voltage different from 0 volts and lower than a voltage corresponding to a logic high level.

Meanwhile, FIG. 8B illustrates a case where bit data of "0" is stored in the main latch ML1. Like FIG. 8A, initially, the cache reset control signal CRST is activated to the high level, so that the initial logic value of the node QC of the cache latch CL becomes 0 and the initial logic value of the node QC_N of the cache latch CL becomes 1.

Also, like FIG. 8A, the SO precharge control signal PRCH_SO is activated to the low level, so that the SO precharge transistor T11 is turned on. Accordingly, the node SO is precharged by the power voltage V1 (①). Subsequently, the bus node precharge control signal CB_H_N is activated to the low level, so that the bus node PBUS is precharged to the power voltage V1 (②).

Since the node QM of the main latch ML1 has a logic value of "0," the latch transistor T1 is turned off. In this state, the first transmission control signal TRAN1, the second transmission control signal TRAN2, and the third transmission control signal TRAN3 are all activated to the high level. Since the latch transistor T1 is turned off, connection of the bus node PBUS and the node SO to the ground is interrupted by the latch transistor T1. Therefore, the voltage state of the bus node PBUS and the node SO, which were initially precharged to the power voltage V1, is maintained. Since the voltage of the bus node PBUS maintains the power voltage V1, the third transmission transistor T6 is turned off even when the third transmission control signal TRAN3 is activated to the high level. Accordingly, the logic value of the node QC_N of the cache latch CL maintains initially 1, and the logic value of the node QC of the cache latch CL also maintains initially 0. Finally, the value of bit data stored in the cache latch CL becomes "0" as the logic value of the node QC.

As shown in FIGS. 8A and 8B, when data is transmitted from the main latch ML1 to the cache latch CL, the bus node PBUS is initially precharged to the power voltage V1. As shown in FIG. 6, the bus node PBUS is shared by the other page buffers, and therefore, a considerably large amount of current may be consumed to precharge the bus node PBUS to the power voltage V1, unlike the node SO. In addition, when the data stored in the main latch ML1 is 1 (see FIG. 8A), the bus node PBUS that was initially precharged to the power voltage V1 is discharged to 0 V. In some embodiments, when the data stored in the main latch ML1 is 1 (see FIG. 8A), the bus node PBUS that was initially precharged to the power voltage V1 is discharged to a voltage denoting a logic value of 0. That is, the voltage of the bus node PBUS swings between the power voltage V1 and a low level or 0 V in a data transmission process. This means that a large amount of current is consumed to transmit data from the main latch ML1 to the cache latch CL.

In accordance with a semiconductor memory device in accordance with an embodiment of the present disclosure, the voltage of the PBUS swings between a voltage lower than the power voltage V1 and 0 V under a situation in which the bus node PBUS is not precharged but discharged in data transmission between the main latch and the cache latch. Accordingly, a peak current consumed in the data transmission between the main latch and the cache latch can be decreased.

Figure 9A:
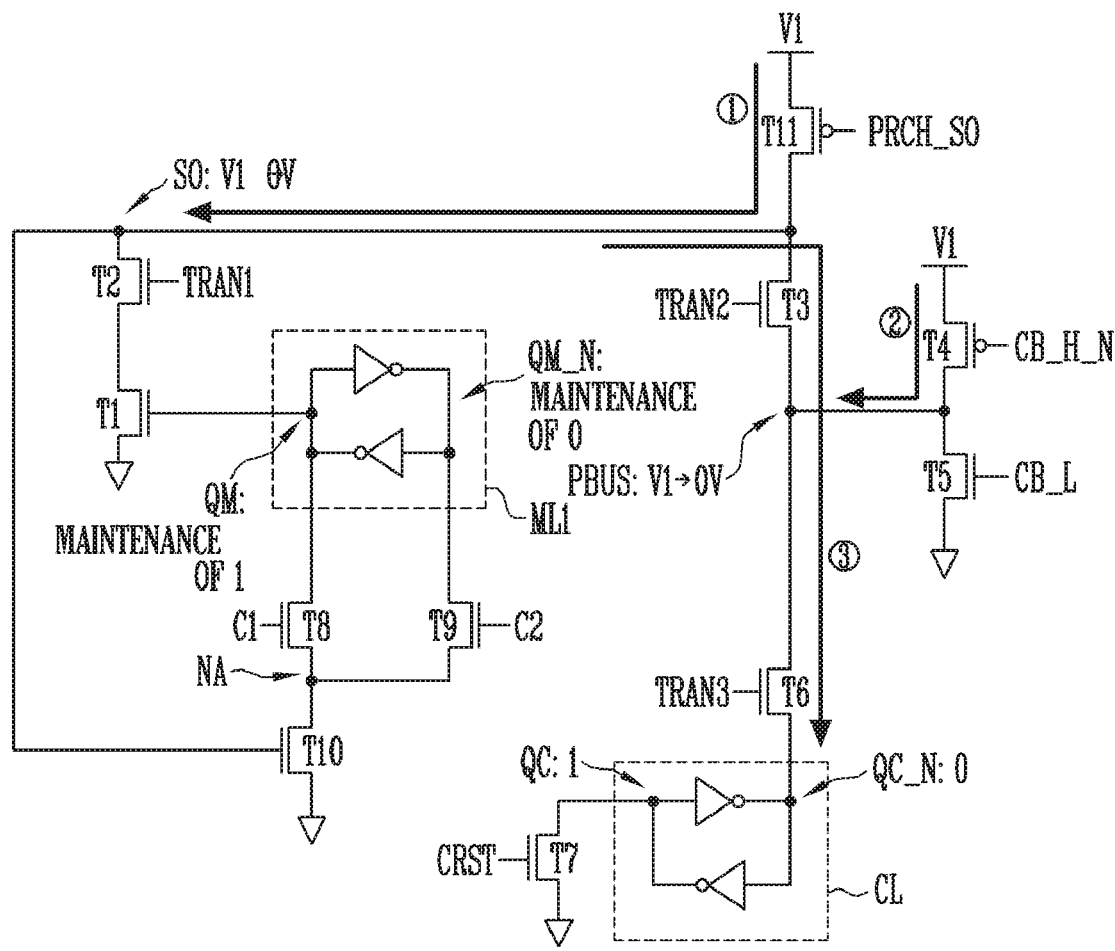
FIGS. 9A and 9B are diagrams illustrating a method in which data of the cache latch shown in FIG. 7 is transmitted to the main latch.
Figure 9B:
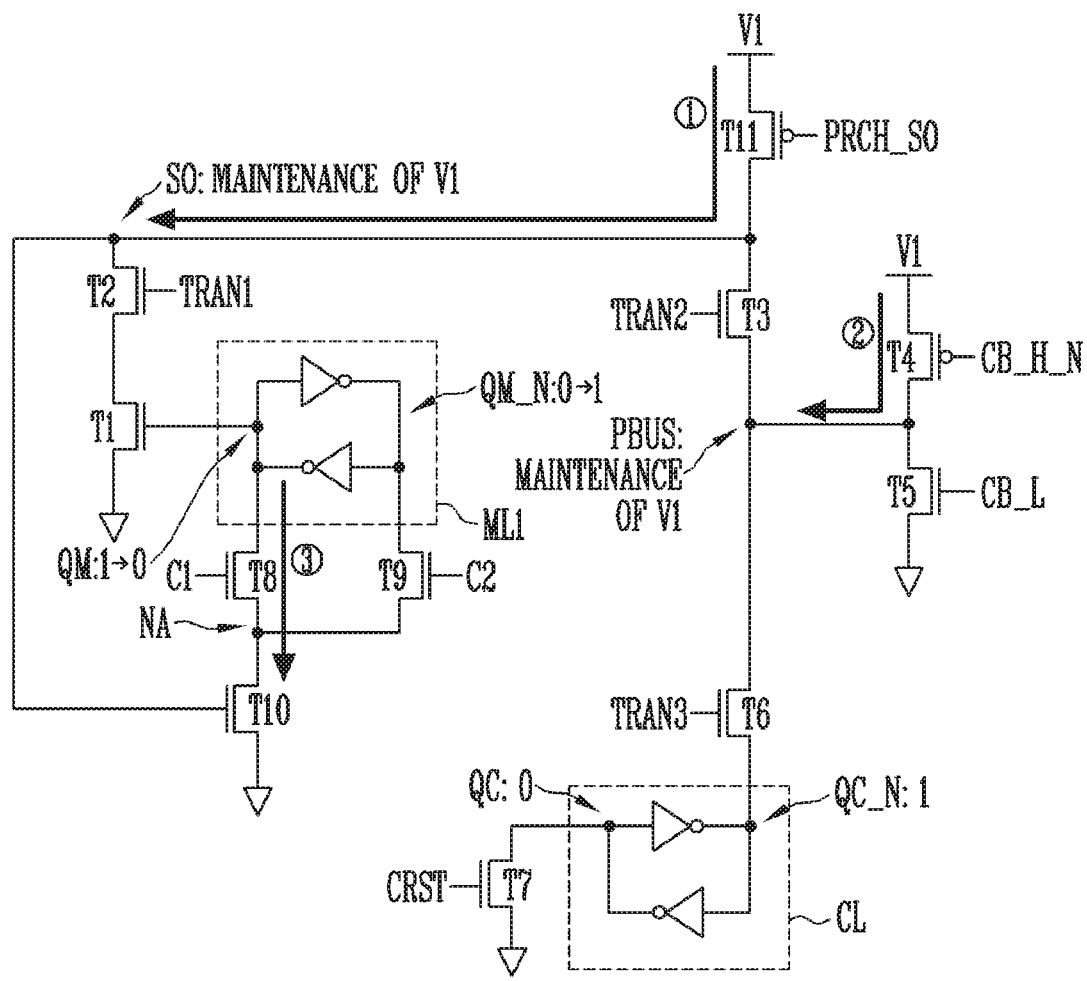

FIGS. 9A and 9B are diagrams illustrating a method in which data of the cache latch shown in FIG. 7 is transmitted to the main latch.

First, FIG. 9A illustrates a case where bit data of "1" is stored in the cache latch CL. Since the bit data of "1" is stored in the cache latch CL, the node QC has a logic value of 1.

Initially, the SO precharge control signal PRCH_SO is activated to the low level, so that the SO precharge transistor T11 is turned on. Accordingly, the node SO is precharged by the power voltage V1 (①). Accordingly, the latch transmission transistor T10 is turned on. In this state, the second latch control signal C2 is activated to the high level, so that the second latch control transistor T9 is turned on. Since the second latch control transistor T9 and the latch transmission transistor T10 are turned on, the initial logic value of the node QM_N of the main latch ML1 becomes 0, and the initial logic value of the node QM of the main latch ML1 becomes 1.

Subsequently, the bus node precharge control signal CB_H_N is activated to the low level, so that the bus node PBUS is precharged to the power voltage V1 (②).

Subsequently, the second transmission control signal TRAN2 and the third transmission control signal TRANS are activated to the high level, so that the second transmission transistor T3 and the third transmission transistor T6 are turned on. Accordingly, the node SO and the bus node PBUS are connected to the node QC_N of the cache latch CL.

Since the bit data stored in the cache latch CL is "1," the node QC_N has a logic value of 0. Accordingly, a current path is formed from the node SO and the bus node PBUS to the node QC_N. Therefore, the voltage that was precharged in the node SO and the bus node PBUS is discharged. That is, the voltage of the node SO is discharged from the power voltage V1 to 0 V.

Subsequently, the first latch control signal C1 is activated to the high level, so that the first latch control transistor T8 is turned on. Although the first latch control transistor T8 is turned on, the voltage of the node SO is in a state in which the voltage of the node SO is decreased to 0 V, and therefore, the latch transmission transistor T10 is in a turn-off state. Accordingly, since the node NA is not connected to the ground, the logic value of the node QM of the main latch ML1 maintains 1 even when the first latch control transistor T8 is turned on. Finally, the value of bit data stored in the main latch ML1 becomes "1" as the logic value of the node QM.

Meanwhile, FIG. 9B illustrates a case where bit data of "0" is stored in the cache latch CL. Since the bit data of "0" is stored in the cache latch CL, the node QC has a logic value of 0.

Initially, the SO precharge control signal PRCH_SO is activated to the low level, so that the SO precharge transistor T11 is turned on. Accordingly, the node SO is precharged by the power voltage V1 (①). Accordingly, the latch transmission transistor T10 is turned on. In this state, the second latch control signal C2 is activated to the high level, so that the second latch control transistor T9 is turned on. Since the second latch control transistor T9 and the latch transmission transistor T10 are turned on, the initial logic value of the node QM_N of the main latch ML1 becomes 0, and the initial logic value of the node QM of the main latch ML1 becomes 1.

Subsequently, the bus node precharge control signal CB_H_N is activated to the low level, so that the bus node PBUS is precharged to the power voltage V1 (②).

Subsequently, the second transmission control signal TRAN2 and the third transmission control signal TRANS are activated to the high level, so that the second transmission transistor T3 and the third transmission transistor T6 are turned on. Accordingly, the node SO and the bus node PBUS are connected to the node QC_N of the cache latch CL.

Since the bit data stored in the cache latch CL is "0," the node QC_N has a logic value of 1. Accordingly, the voltage of the bus node PBUS maintains the power voltage V1 even when the third transmission transistor T6 is turned on. In addition, the voltage of the node SO maintains the power voltage V1 even when the second transmission transistor T3 is turned on. Since the voltage of the node SO maintains the power voltage V1, the latch transmission transistor T10 maintains a turn-on state.

Subsequently, the first latch control signal C1 is activated to the high level, so that the first latch control transistor T8 is turned on. Since the first latch control transistor T8 is turned on, and the latch transmission transistor T10 is also in the turn-on state, the node NA and the node QM are connected to the ground. Finally, the value of bit data stored in the main latch ML1 becomes "0" as the logic value of the node QM.

As shown in FIGS. 9A and 9B, when data is transmitted from the cache latch CL to the main latch ML1, the bus node PBUS is initially precharged to the power voltage V1. As shown in FIG. 6, the bus node PBUS is shared by the other page buffers, and therefore, a considerably large amount of current may be consumed to precharge the bus node PBUS to the power voltage V1, unlike the node SO. In addition, when the data stored in the cache latch CL is 1 (see FIG. 9A), the bus node PBUS that was initially precharged to the power voltage V1 is discharged to 0 V. That is, the voltage of the bus node PBUS swings between the power voltage V1 and 0 V in a data transmission process. This means that a large amount of current is consumed to transmit data from the main latch ML1 to the cache latch CL.

In accordance with the semiconductor memory device in accordance with an embodiment of the present disclosure, the voltage of the PBUS swings between a voltage lower than the power voltage V1 and 0 V under a situation in which the bus node PBUS is not precharged but discharged in data transmission between the main latch and the cache latch.

Accordingly, a peak current consumed in the data transmission between the main latch and the cache latch can be decreased.

Figure 10:
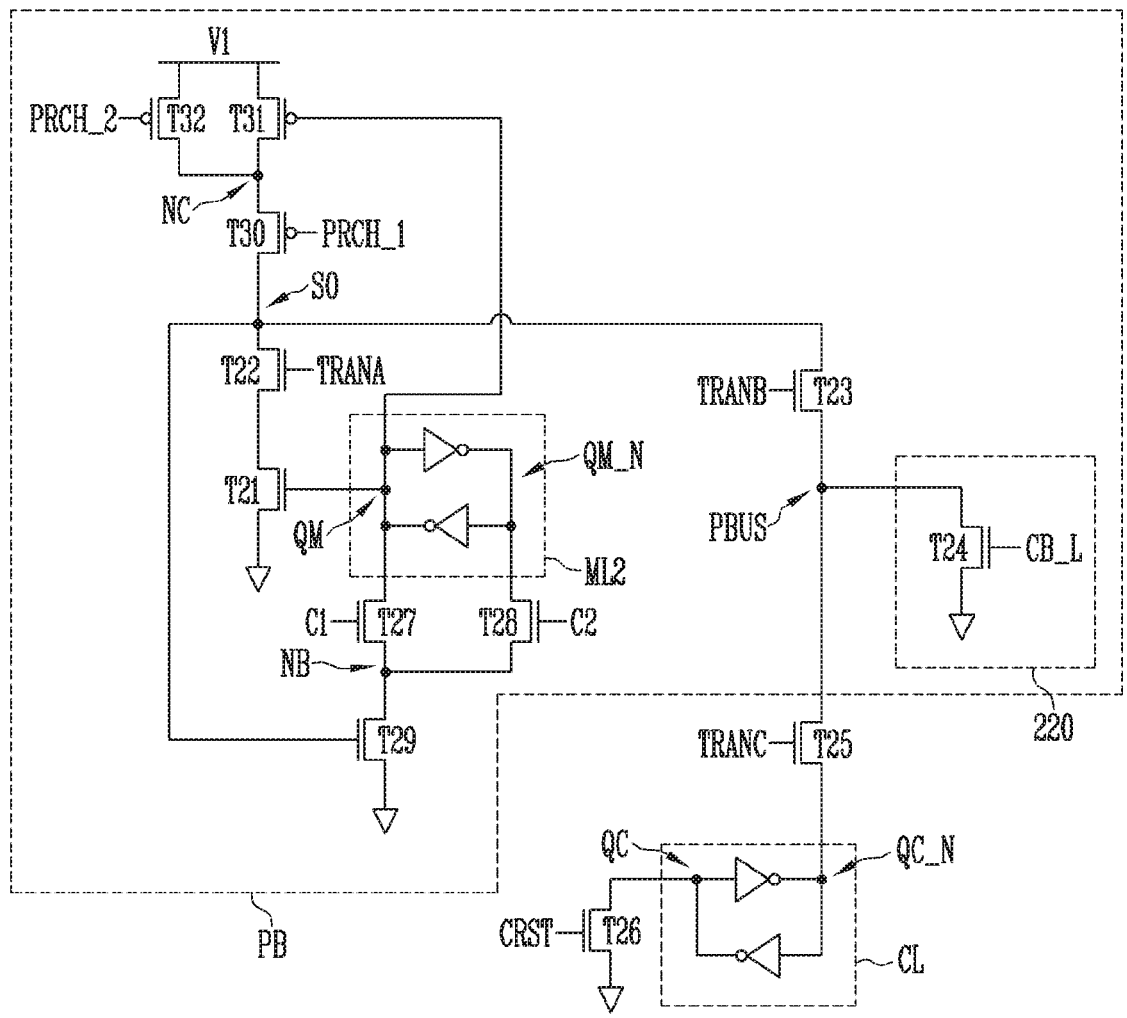
FIG. 10 is a circuit diagram illustrating a structure of a page buffer and a cache latch connected thereto in accordance with another embodiment of the present disclosure.

FIG. 10 is a circuit diagram illustrating a structure of a page buffer PB and a cache latch CL connected thereto in accordance with another embodiment of the present disclosure. In FIG. 10, illustration of a connection relationship between the page buffer PB and a bit line corresponding thereto will be omitted.

Referring to FIG. 10, the page buffer PB includes a main latch ML2, a latch transistor T21, a first transmission transistor T22, a first latch control transistor T27, a second latch control transistor T28, a second transmission transistor T23, a latch transmission transistor T29, a first SO precharge transistor T30, a second SO precharge transistor T31, a third SO precharge transistor T32, and a bus node setting component 220. The bus node setting component 220 includes a bus node discharge transistor T24. The page buffer PB is connected to the cache latch CL through a third transmission transistor T25. A cache reset transistor T26 is connected between a node QC of the cache latch and a ground.

A gate terminal of the latch transistor T21 is connected to a node QM of the main latch ML2. The latch transistor T21 is connected between the first transmission transistor T22 and the ground. The first transmission transistor T22 is connected between a node SO and the latch transistor T21. The second transmission transistor T23 is connected between the node SO and a bus node PBUS. The first latch control transistor T27 is connected between the node QM of the main latch ML2 and a node NB. The second latch control transistor T28 is connected between a node QM_N of the main latch ML2 and the node NB. The latch transmission transistor T29 is connected between the node NB and the ground. Also, a gate terminal of the latch transmission transistor T29 is connected to the node SO. The first SO precharge transistor T30 and the second SO precharge transistor T31 are connected between a power voltage V1 and the node SO. For example, the first SO precharge transistor T30 is connected between a node NC and the node SO. The second SO precharge transistor T31 is connected between the node NC and the power voltage V1. The third SO precharge transistor T32 is connected between the power voltage V1 and the first SO precharge transistor T30. For example, the third SO precharge transistor T32 is connected between the node NC and the power voltage V1. In an embodiment shown in FIG. 10, the first to third SO precharge transistors T30, T31, and T32 may be implemented with a PMOS transistor, and the other transistors may be implemented with an NMOS transistor.

A first transmission control signal TRANA, a second transmission control signal TRANB, and a third transmission control signal TRANC are respectively applied to gate terminals of the first transmission transistor T22, the second transmission transistor T23, and the third transmission transistor T25. A first latch control signal C1 and a second latch control signal C2 are respectively applied to gate terminal of the first latch control transistor T27 and the second latch control transistor T28. First and second SO precharge control signals PRCH_1 and PRCH_2 are respectively applied to gate terminals of the first and third SO precharge transistors T30 and T32. A gate terminal of the second SO precharge transistor T31 is connected to the node QM of the main latch ML2. A bus node discharge control signal CB_L is applied to a gate terminal of the bus node discharge transistor T24. A cache reset control signal CRST is applied to a gate terminal of the cache reset transistor T26.

The bus node discharge transistor T24 is connected between the bus node PBUS and the ground.

In FIG. 10, a case where the bus node setting component 220 is included in the page buffer PB is illustrated. Therefore, each of the plurality of page buffers PB1 to PBm may include a bus node setting component. However, since the bus node PBUS is commonly connected to the plurality of page buffers PB1 to PBm, only one bus node setting component 210 may be connected for each bus node PBUS, without being included in each of the page buffers.

Through the circuit shown in FIG. 10, bit data stored in the main latch ML2 of the page buffer PB may be transmitted to the cache latch CL, and bit data stored in the cache latch CL may be transmitted to the main latch ML2. Data transmission method between the main latch ML2 and the cache latch CL will be described later with reference to FIGS. 11A to 14.

Figure 11A:
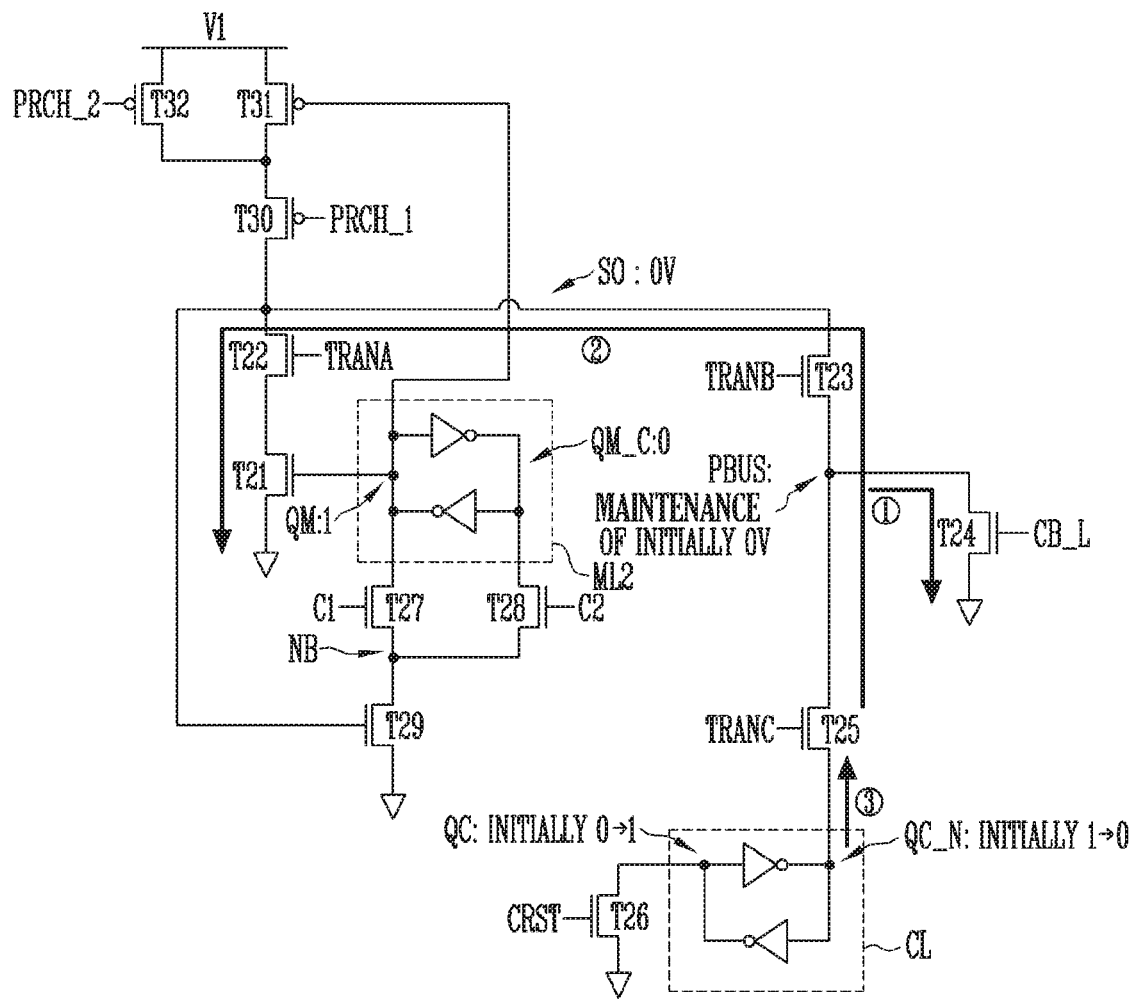
FIGS. 11A and 11B are diagrams illustrating a method in which data of a main latch shown in FIG. 10 is transmitted to the cache latch.
Figure 11B:
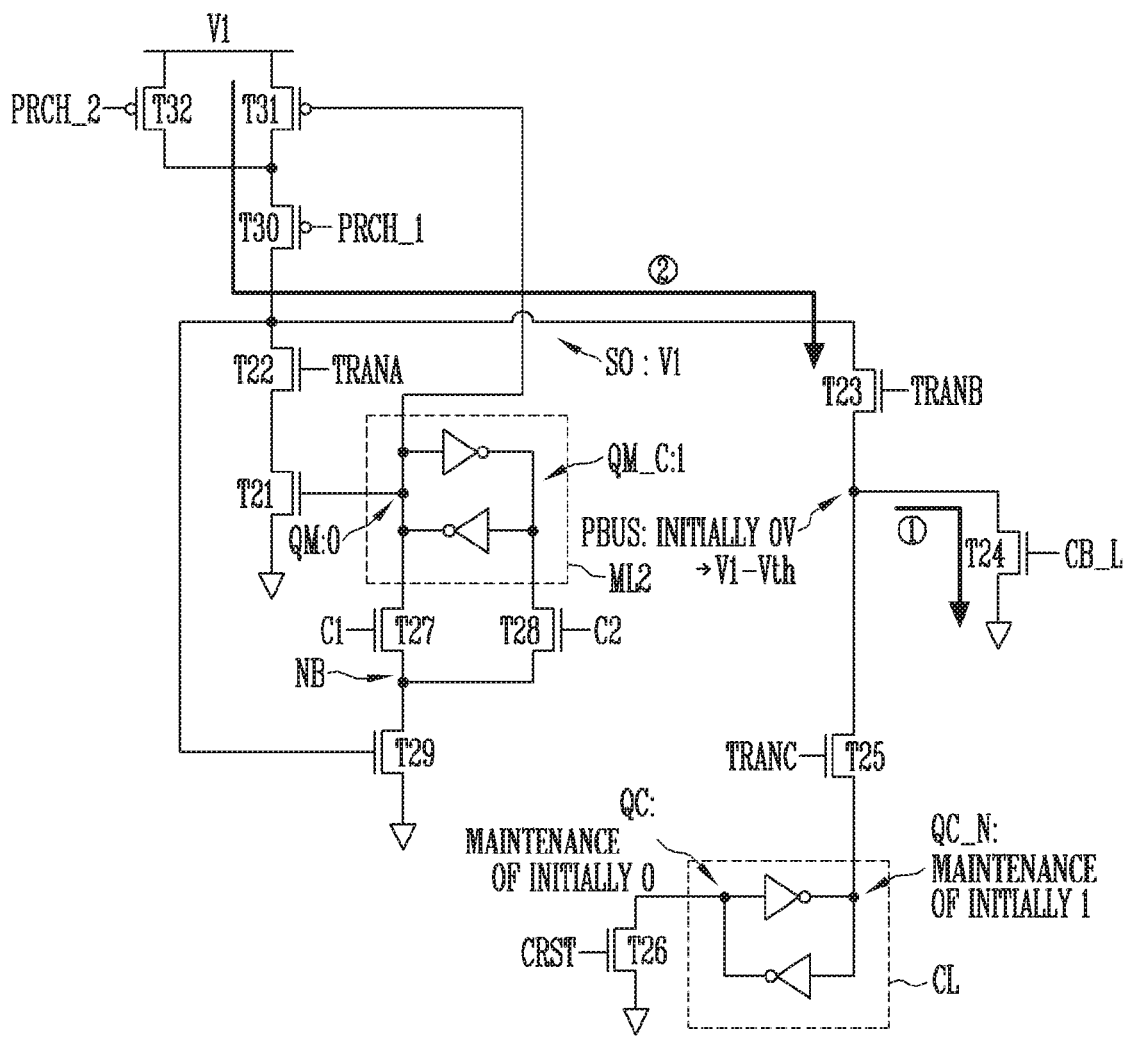

FIGS. 11A and 11B are diagrams illustrating a method in which data of the main latch shown in FIG. 10 is transmitted to the cache latch.

First, FIG. 11A illustrates a case where bit data of "1" is stored in the main latch ML2. Initially, the cache reset control signal CRST is activated to the high level, so that the initial logic value of the node QC of the cache latch CL becomes 0 and the initial logic value of a node QC_N of the cache latch CL becomes 1.

The bus node discharge control signal CB_L is activated to the high level, so that the bus node PBUS is discharged to 0 V (①). Meanwhile, since the logic value of the node QM is 1, the latch transistor T21 maintains the turn-on state. Subsequently, when the first no transmission transistor T22 and the second transmission transistor T23 are turned on, the voltage of the node SO is decreased from the power voltage V1 to a ground voltage (0 V), and the voltage of the bus node PBUS maintains initially 0 V (②).

Therefore, when the third transmission transistor T25 is turned on, the logic value of the node QC_N is changed from "1" to "0," and the logic value of the node QC is changed from "0" to "1" (③).

FIG. 11B illustrates a case where bit data of "0" is stored in the main latch ML2. Initially, the cache reset control signal CRST is activated to the high level, so that the initial logic value of the node QC of the cache latch CL becomes 0 and the initial logic value of the node QC_N of the cache latch CL becomes 1.

First, the bus node discharge control signal CB_L is activated to the high level, so that the bus node PBUS is discharged to 0 V (①). Meanwhile, since the logic value of the node QM of the main latch ML2 is "0," the second SO precharge transistor T31 as a PMOS transistor is in the turn-on state. In this situation, the first SO precharge control signal PRCH_1 is activated to the low level, so that the first SO precharge transistor T30 is turned on. Accordingly, the node SO is precharged to the power voltage V1. Meanwhile, the second transmission control signal TRANB is activated to the power voltage V1.

Since the gate voltage of the second transmission transistor T23 is the power voltage V1 activated by the second transmission control signal TRANB, and the drain voltage of the second transmission transistor T23, i.e., the voltage of the node SO is also the power voltage V1, the source voltage of the second transmission transistor T23, i.e., the voltage of the bus node PBUS becomes V1−Vth (②). Vth is a value corresponding to the threshold voltage of the second transmission transistor T23. In an embodiment shown in FIG. 11B, the voltage applied to a gate of the second transmission transistor T23 is the power voltage V1. In some embodiments, a voltage slightly lower than the power voltage V1 may be used as the voltage applied to the gate of the second transmission transistor T23.

The third transmission control signal TRANC is activated to the high level under a situation in which the voltage of the bus node PBUS is V1−Vth. Accordingly, the logic value of the node QC_N maintains initially "1," and the logic value of the node QC also maintains initially "1." That is, when bit data stored in the main latch ML2 is "1," the cache latch CL also maintains bit data of "1."

Figure 12:
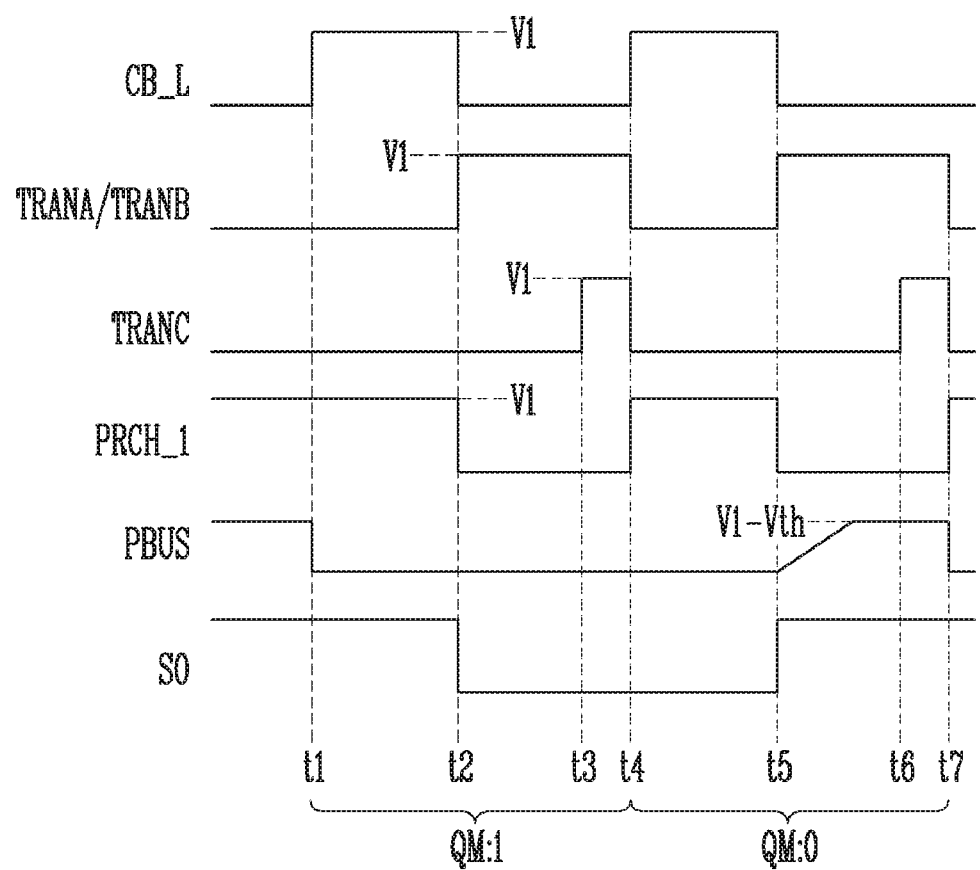
FIG. 12 is a timing diagram illustrating a process in which data of the main latch is transmitted to the cache latch.

FIG. 12 is a timing diagram illustrating a process in which data of the main latch is transmitted to the cache latch.

In FIG. 12, timing diagrams of voltage levels of the bus discharge control signal CB_L, the first and second transmission control signals TRANA and TRANB, the third transmission control signal TRANC, and the first SO precharge control signal and voltage levels of the bus node PBUS and the node SO are sequentially illustrated. A period t1 to t4 illustrates an operation when the logic value of the node QM of the main latch ML2 is "1," and a period t4 to t7 illustrates an operation when the logic value of the node QM of the main latch ML2 is "0."

First, at a time t1, the bus discharge control signal CB_L is activated to the high level, so that the bus node PBUS is discharged to 0 V. At a time t2, when the first and second transmission control signals TRANA and TRANB are activated to the power voltage V1, the voltage of the node SO becomes 0 V, and the voltage of the bus node PBUS maintains initially 0 V, Since the logic value of the node QM is "1," the second SO precharge transistor T31 maintains the turn-off state. Accordingly, the voltage of the node SO becomes 0 V even when the first SO precharge control signal PRCH_1 is activated to the low level at the time t2.

Subsequently, at a time t3, when the third transmission control signal TRANC is activated to the power voltage V1, the value stored in the cache latch is changed to 1.

Subsequently, at a time t4, the bus discharge control signal CB_L is activated to the high level, so that the bus node PBUS is discharged to 0 V. Since the logic value of the node QM is "0," the second SO precharge transistor T31 maintains the turn-on state. At a time t5, when the first SO precharge control signal PRCH_1 is activated to the low level, the voltage of the node SO becomes V1. Meanwhile, the voltage value of the bus node PBUS is increased from initially 0 V to V1−Vth when the second transmission control signal TRANB is activated to the power voltage V1 at the time t5. Subsequently, at a time t6, the value stored in the cache latch CL maintains 0 even when the third transmission control signal TRANC is activated to the high level, i.e., the power voltage V1.

Referring to the embodiments shown in FIGS. 8A and 8B, the voltage of the bus node PBUS swings between 0 V and the power voltage V1 in a process of transmitting data from the main latch ML1 to the cache latch CL. On the other hand, referring to FIG. 12, the voltage level of the bus node PBUS swings between 0 V and V1−Vth. Thus, in accordance with the embodiments shown in FIGS. 10 to 12, the voltage swing width of the bus node PBUS is narrow, and hence a smaller amount of current is consumed. Accordingly, a peak current consumed in data transmission between the main latch and the cache latch can be decreased.

Figure 13A:
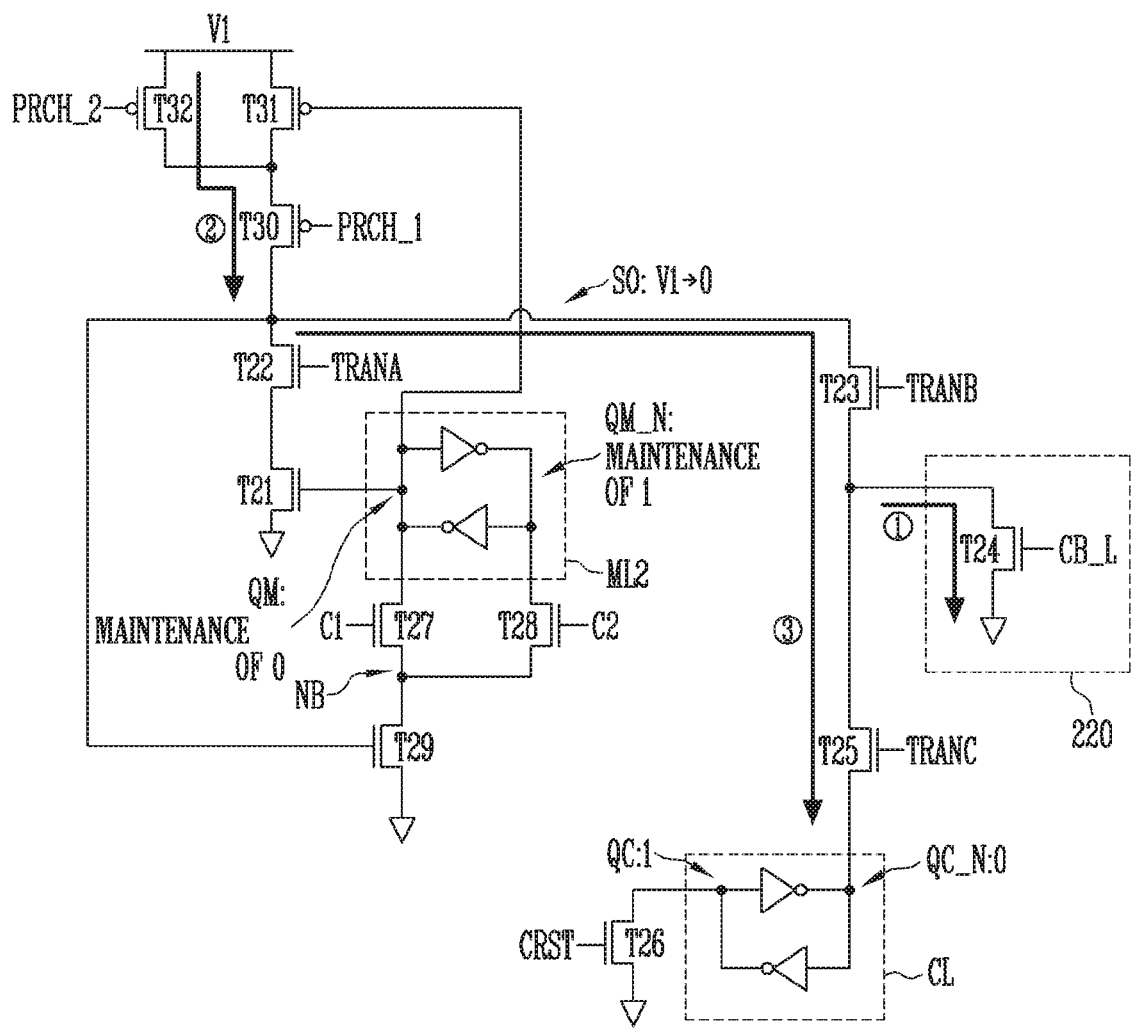
FIGS. 13A and 13B are diagrams illustrating a method in which data of the cache latch shown in FIG. 10 is transmitted to the main latch.
Figure 13B:
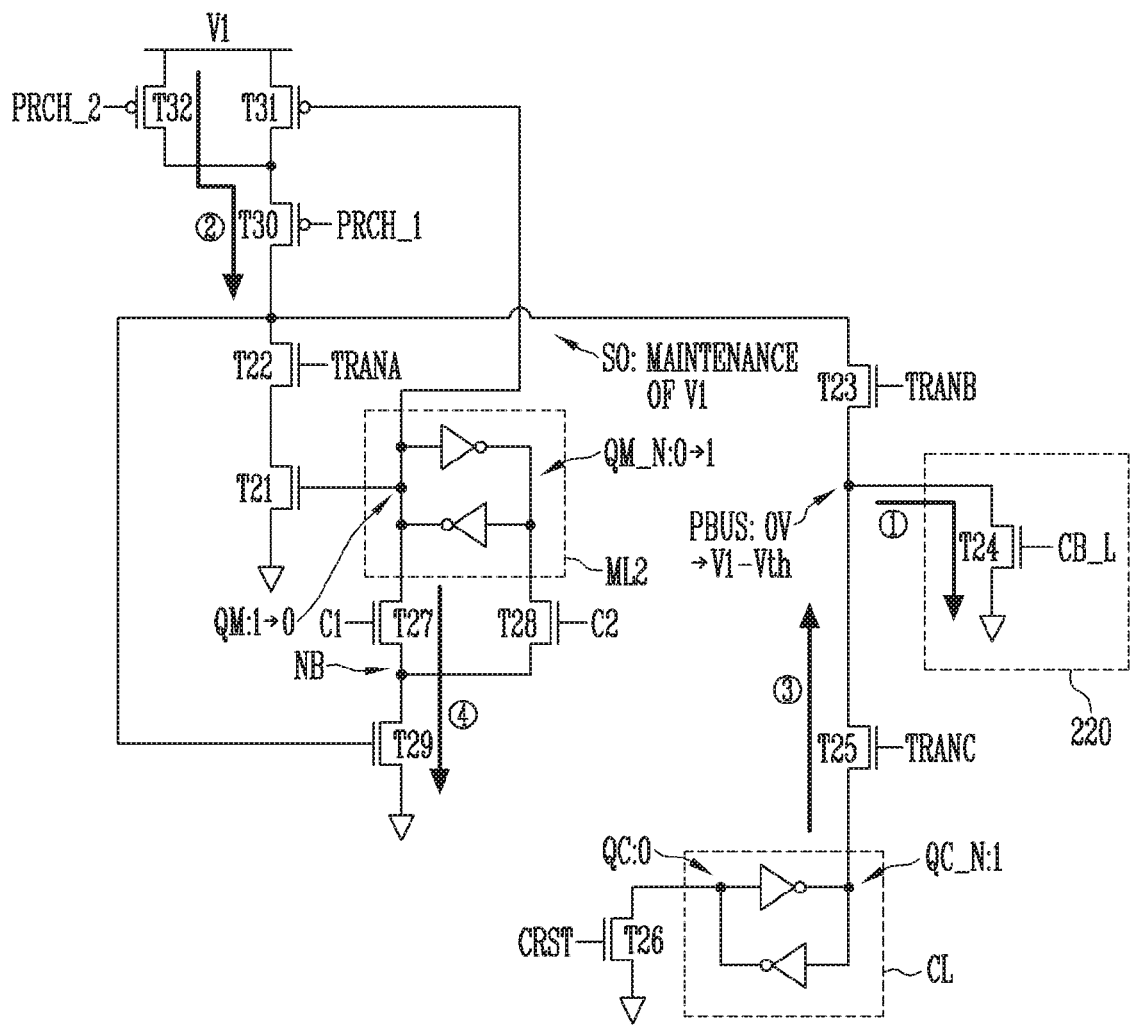

FIGS. 13A and 13B are diagrams illustrating a method in which data of the cache latch shown in FIG. 10 is transmitted to the main latch.

First, FIG. 13A illustrates a case where bit data of "1" is stored in the cache latch CL. Since the bit data of "1" is stored in the cache latch CL, the node QC has a logic value of 1.

The bus node discharge control signal CB_L is activated to the high level, the bus node PBUS is discharged to 0 V (①). Subsequently, the first and second SO precharge control signals PRCH_1 and PRCH_2 are activated to the low level, so that the node SO is precharged to the power voltage V1 (②), Since the node SO is precharged to the power voltage V1, the latch transmission transistor T29 is in the turn-on state. In this situation, the second latch control signal C2 is activated to the high level, so that the second latch control transistor T28 is turned on. Accordingly, the node QM_N of the main latch ML2 is initialized to a logic value of "0," and the node QM of the main latch ML2 is initialized to a logic value of "1."

Subsequently, the third transmission control signal TRANC is activated to the high level, i.e., the level of the power voltage V1, and the second transmission control signal TRANB is activated in a state in which the third transmission control signal TRANC is activated. Since the logic value of the node QC_N of the cache latch CL is "0," the voltage of the bus node PBUS maintains 0 V, and the voltage of the node SO is decreased from initially V1 to 0 V.

Since the voltage of the node SO is 0 V, the latch transmission transistor T29 is turned off. Subsequently, the logic value of the node QM is maintained as "1" even when the first latch control signal C1 is activated to the high level.

FIG. 13B illustrates a case where bit data of "0" is stored in the cache latch CL. Since the bit data of "0" is stored in the cache latch CL, the node QC has a logic value of 0.

The bus node discharge control signal CB_L is activated to the high level, the bus node PBUS is discharged to 0 V (①). Subsequently, the first and second SO precharge control signals PRCH_1 and PRCH_2 are activated to the low level, so that the node SO is precharged to the power voltage V1 (②). Since the node SO is precharged to the power voltage V1, the latch transmission transistor T29 is in the turn-on state. In this situation, the second latch control signal C2 is activated to the high level, so that the second latch control transistor T28 is turned on. Accordingly, the node QM_N of the main latch ML2 is initialized to a logic value of "0," and the node QM of the main latch ML2 is initialized to a logic value of "1."

Subsequently, the third transmission control signal TRANC is activated to the high level. When the logic value of the node QC_N is "1," and the internal power voltage of the cache latch CL is the power voltage V1, the voltage of the node QC_N may also become the power voltage V1. When the third transmission control signal TRANC is activated to the power voltage V1, the power voltage V1 is applied to a gate of the third transmission transistor T25.

Since the gate voltage of the third transmission transistor T25 is the power voltage V1 activated by the third transmission control signal TRANC, and the drain voltage of the third transmission transistor T25, i.e., the voltage of the node is also the power voltage V1, the source voltage of the third transmission transistor T25, i.e., the voltage of the bus node PBUS becomes V1−Vth (③). Vth is a value corresponding to the threshold voltage of the third transmission transistor T25. In an embodiment shown in FIG. 13B, the voltage applied to the gate of the third transmission transistor T25 is the power voltage V1. In some embodiments, a voltage slightly lower than the power voltage V1 may be used as the voltage applied to the gate of the third transmission transistor T25.

Under a situation in which the voltage of the bus node PBUS is V1−Vth, the second transmission control signal TRANB is activated to the high level. Accordingly, the voltage of the node SO maintains V1 that is an initial voltage value. Since the voltage of the node SO is V1, the latch transmission transistor T29 is turned on. Subsequently, when the first latch control signal C1 is activated to the high level, the logic value of the node QM is changed from "1" to "0."

Figure 14:
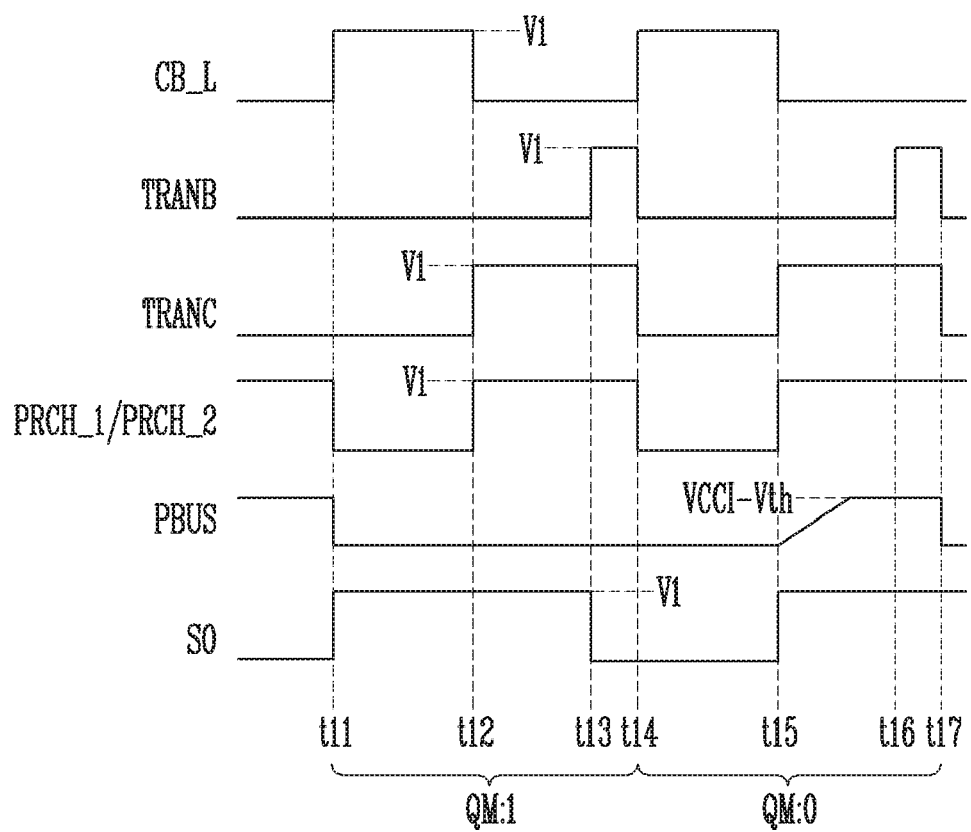
FIG. 14 is a timing diagram illustrating a process in which data of the cache latch is transmitted to the main latch.

FIG. 14 is a timing diagram illustrating a process in which data of the cache latch is transmitted to the main latch.

In FIG. 14, timing diagrams of voltage levels of the bus discharge control signal CB_L, the second transmission control signal TRANB, the third transmission control signal TRANC, and the first and second SO precharge control signals PRCH_1 and PRCH_2 and voltage levels of the bus node PBUS and the node SO are sequentially illustrated. A period t11 to t14 illustrates an operation when the logic value of the node QC of the cache latch CL is "1," and a period t14 to t17 illustrates an operation when the logic value of the node QC of the cache latch CL is "0."

First, at a time t11, the bus discharge control signal CB_L is activated to the high level, so that the bus node PBUS is discharged to 0 V. Meanwhile, at the time t11, the first and second SO precharge control signals PRCH_1 and PRCH_2 are activated to the low level, so that the node SO is precharged to the power voltage V1.

At a time t12, the third transmission control signal TRANC is activated to the power voltage V1. At a time t13, the second transmission control signal TRANB is activated to the power voltage V1. Since the logic value of the node QC_N of the cache latch CL is "0," the voltage of the bus node PBUS maintains 0 V, and the voltage of the node SO is decreased from initially V1 to 0 V. Therefore, the value of data bit stored in the main latch ML2 is maintained as "1."

Subsequently, at a time t14, the bus discharge control signal CB_L is again activated to the high level, so that the bus node PBUS is discharged to 0 V. At the time t11, the first and second SO precharge control signals PRCH_1 and PRCH_2 are activated to the low level, so that the node SO is precharged to the power voltage V1.

At a time t15, the third transmission control signal TRANC is activated to the power voltage V1. Since the logic value of the node QC_N of the cache latch is "1," the voltage of the bus node PBUS is increased from initially 0 V to V1−Vth, when the third transmission control signal TRANC is activated to the power voltage V1. Subsequently, at a time t16, the second transmission control signal TRANB is activated to the power voltage V1. The voltage of the node SO maintains initially V1, and the value of data bit stored in the main latch ML2 is changed from "1" to "0."

Referring to the embodiments shown in FIGS. 9A and 9B, the voltage of the bus node PBUS swings between 0 V and the power voltage V1 in a process of transmitting data from the cache latch CL to the main latch ML1. On the other hand, referring to FIG. 14, the voltage level of the bus node PBUS swings between 0 V and V1−Vth. Thus, in accordance with the embodiments shown in FIGS. 10 to 14, the voltage swing width of the bus node PBUS is narrow, and hence a smaller amount of current is consumed. Accordingly, a peak current consumed in data transmission between the main latch and the cache latch can be decreased.

Figure 15:
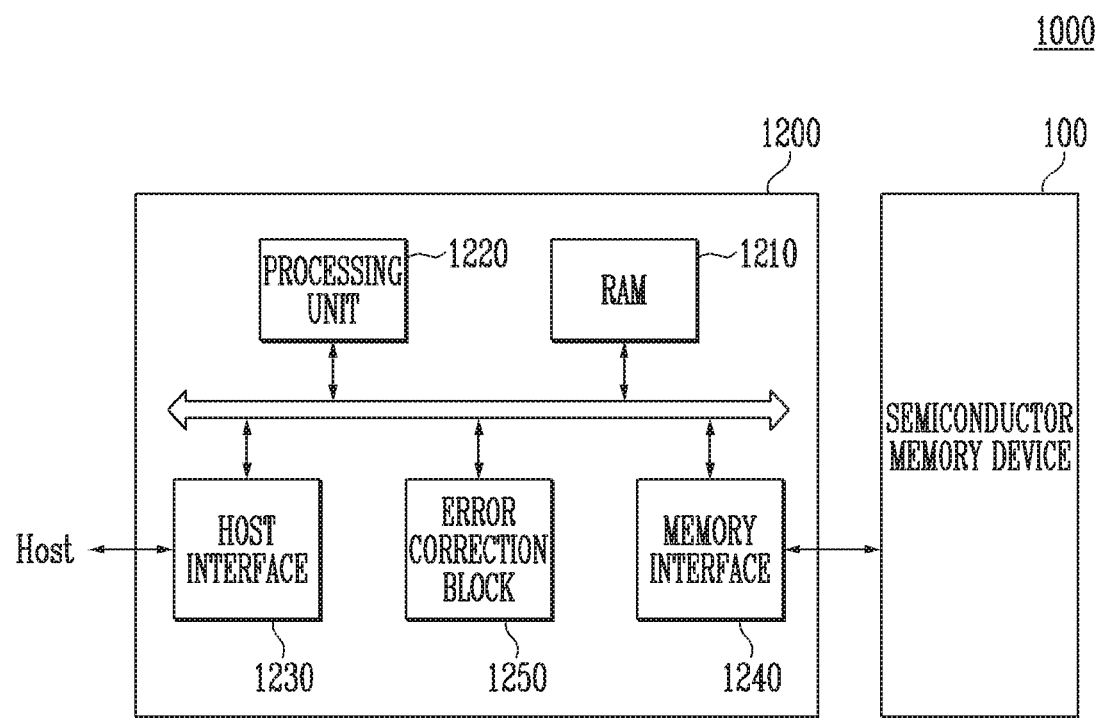
FIG. 15 is a block diagram illustrating a memory system including the semiconductor memory device shown in FIG. 1.

FIG. 15 is a block diagram illustrating a memory system 1000 including the semiconductor memory devices 100 shown in FIG. 1.

Referring to FIG. 15, the memory system 1000 includes a semiconductor memory device 100 and a controller 1200.

The semiconductor memory device 100 may be configured and operated identically or similar to the semiconductor memory devices described with reference to FIGS. 1 to 14. Hereinafter, overlapping descriptions will be omitted.

The controller 1200 is connected to a host Host and the semiconductor memory device 100. The controller 1200 accesses the semiconductor memory device 100 in response to a request from the host Host. For example, the controller 1200 controls read, write, erase, and background operations of the semiconductor memory device 100. The controller 1200 provides an interface between the semiconductor memory device 100 and the host Host. The controller 1200 drives firmware for controlling the semiconductor memory device 100.

The controller 1200 includes a random access memory (RAM) 1210, a processing unit 1220, a host interface 1230, a memory interface 1240, and an error correction block 1250. The RAM 1210 is used as any one of a working memory of the processing unit 1220, a cache memory between the semiconductor memory device 100 and the host Host, and a buffer memory between the semiconductor memory device 100 and the host Host. The processing unit 1220 controls overall operations of the controller 1200.

The host interface 1230 includes a protocol for exchanging data between the host Host and the controller 1200. In an embodiment, the controller 1200 is configured to communicate with the host Host through at least one of various interface protocols such as a Universal Serial Bus (USB) protocol, a Multi-Media Card (MMC) protocol, a Peripheral Component Interconnection (PCI) protocol, a PCI-Express (PCI-E) protocol, an Advanced Technology Attachment (ATA) protocol, a Serial-ATA protocol, a Parallel-ATA protocol, a Small Computer Small Interface (SCSI) protocol, an Enhanced Small Disk Interface (ESDI) protocol, an Integrated Drive Electronics (IDE) protocol, and a private protocol.

The memory interface 1240 interfaces with the semiconductor memory device 100. For example, the memory interface 1240 may include a NAND interface or a NOR interface.

The error correction block 1250 detects and corrects an error of data received from the semiconductor memory device 100 by using an error correction code (ECC).

The controller 1200 and the semiconductor memory device 100 may be integrated into one semiconductor device. In an embodiment, the controller 1200 and the semiconductor memory device 100 may be integrated into one semiconductor device, to constitute a memory card. For example, the controller 1200 and the semiconductor memory device 100 may be integrated into one semiconductor device, to constitute a memory card such as a PC card (Personal Computer Memory Card International Association (PCMCIA)), a Compact Flash (CF) card, a Smart Media Card (SM or SMC), a memory stick, a Multi-Media Card (MMC, RS-MMC or MMCmicro), an SD Card (SD, miniSD, microSD or SDHC), or a Universal Flash Storage (UFS).

The controller 1200 and the semiconductor memory device 100 may be integrated into one semiconductor device to constitute a semiconductor drive (solid state drive (SSD)). The semiconductor drive SSD includes a storage device configured to store data in a semiconductor memory. If the memory system 1000 is used as the semiconductor drive SSD, the operating speed of the host Host connected to the memory system 1000 can be remarkably improved.

As another example, the memory system 1000 may be provided as one of various components of an electronic device such as a computer, an Ultra Mobile PC (UMPC), a workstation, a net-book, a Personal Digital Assistant (PDA), a portable computer, a web tablet, a wireless phone, a mobile phone, a smart phone, an e-book, a Portable Multimedia Player (PMP), a portable game console, a navigation system, a black box, a digital camera, a 3-dimensional television, a digital audio recorder, a digital audio player, a digital picture recorder, a digital picture player, a digital video recorder, a digital video player, a device capable of transmitting/receiving information in a wireless environment, one of various electronic devices that constitute a home network, one of various electronic devices that constitute a computer network, one of various electronic devices that constitute a telematics network, an RFID device, or one of various components that constitute a computing system.

In an embodiment, the semiconductor memory devices 100 or the memory systems 1000 may be packaged in various forms. For example, the semiconductor memory devices 100 or the memory systems 1000 may be packaged in a manner such as Package On Package (PoP), Ball Grid Arrays (BGAs), Chip Scale Packages (CSPs), Plastic Leaded Chip Carrier (PLCC), Plastic Dual In-line Package (PDIP), die in Waffle pack, die in wafer form, Chip On Board (COB), CERamic Dual In-line Package (CERDIP), plastic Metric Quad Flat Pack (MQFP), Thin Quad Flat Pack (TQFP), Small Outline Integrated Circuit (SOIC), Shrink Small Outline Package (SSOP), Thin Small Outline Package (TSOP), System In Package (SIP), Multi-Chip Package (MCP), Wafer-level Fabricated Package (WFP), or Wafer-level processed Stack Package (WSP).

Figure 16:
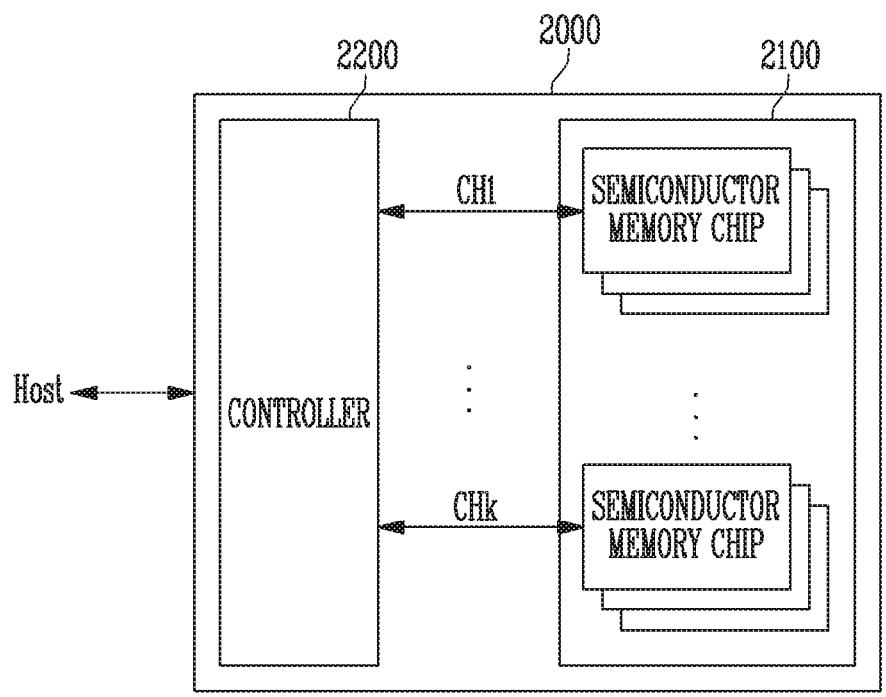
FIG. 16 is a block diagram illustrating an application example of the memory system shown in FIG. 15.

FIG. 16 is a block diagram illustrating an application example 2000 of the memory systems 1000 shown in FIG. 15.

Referring to FIG. 16, the memory system 2000 includes a semiconductor memory device 2100 and a controller 2200. The semiconductor memory device 2100 includes a plurality of semiconductor memory chips. The plurality of semiconductor memory chips are divided into a plurality of groups.

FIG. 16 illustrates that the plurality of groups communicate with the controller 2200 through first to kth channels CH1 to CHk, Each semiconductor memory chip may be configured and operated identically or similar to the semiconductor memory devices 100 described with reference to FIG. 1.

Each group is configured to communicate with the controller 2200 through one common channel. The controller 2200 is configured identically or similar to the controller 1200 described with reference to FIG. 15. The controller 2200 is configured to control the plurality of memory chips of the semiconductor memory device 2100 through the plurality of channels CH1 to CHk.

In FIG. 16, a case where a plurality of semiconductor memory chips are connected to one channel is described. However, it will be understood that the memory system 2000 may be modified such that one semiconductor memory chip is connected to one channel.

Figure 17:
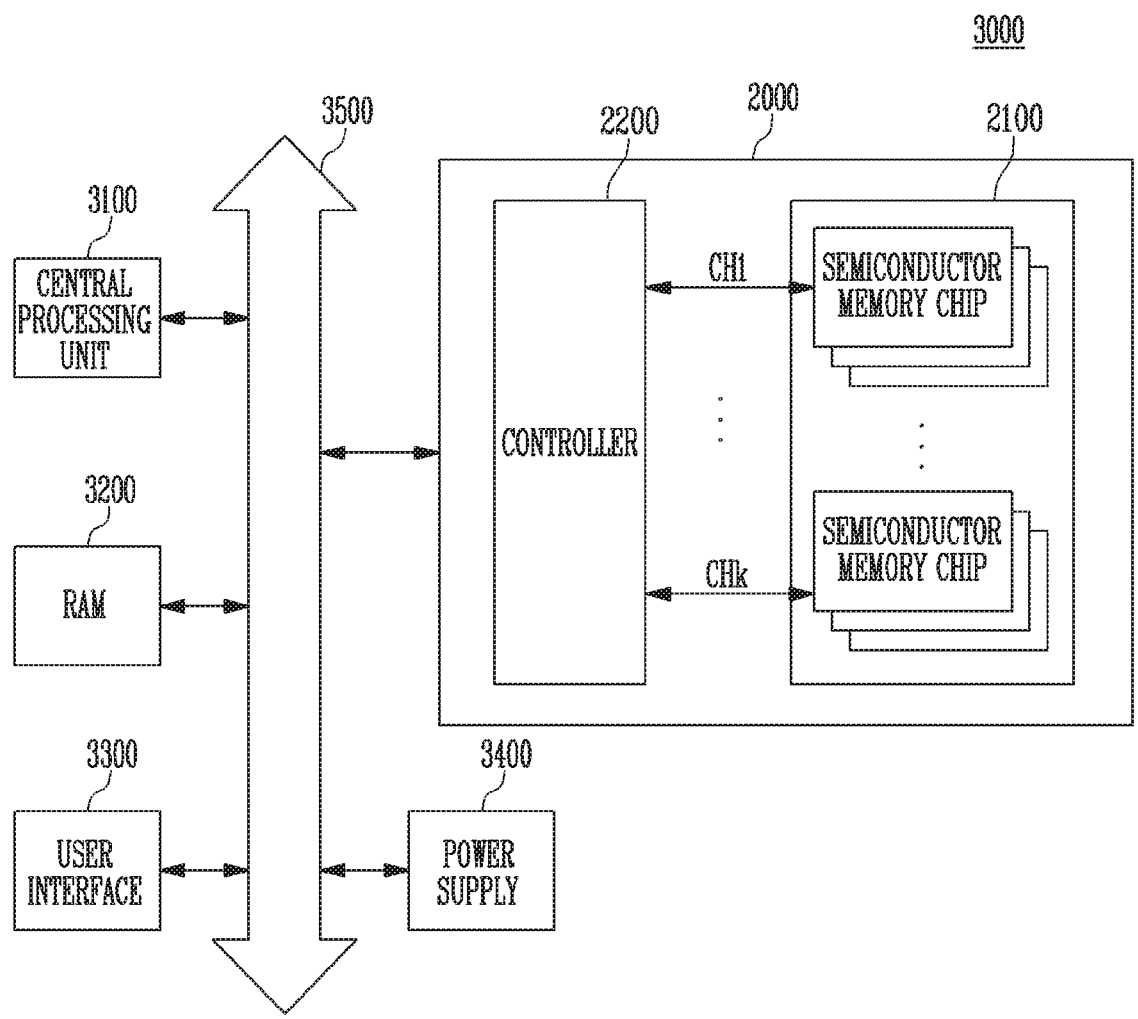
FIG. 17 is a block diagram illustrating a computing system including the memory system described with reference to FIG. 16.

FIG. 17 is a block diagram illustrating a computing system including the memory system 2000 described with reference to FIG. 16.

Referring to FIG. 17, the computing system 3000 includes a central processing unit 3100, a RAM 3200, a user interface 3300, a power supply 3400, a system bus 3500, and the memory system 2000.

The memory system 2000 is electrically connected to the central processing unit 3100, the RAM 3200, the user interface 3300, and the power supply 3400 through the system bus 3500. Data supplied through user interface 3300 or data processed by the central processing unit 3100 are stored in the memory system 2000.

FIG. 17 illustrates that the semiconductor memory device 2100 is connected to the system bus 3500 through the controller 2200. However, the semiconductor memory device 2100 may be directly connected to the system bus 3500. The function of the controller 2200 may be performed by the central processing unit 3100 and the RAM 3200.

FIG. 17 illustrates that the memory system 2000 described with reference to FIG. 16 is provided. However, the memory system 2000 may be replaced by the memory systems 1000 described with reference to FIG. 15. In an embodiment, the computing system 3000 may include both of the memory systems 1000 and 2000 described with reference to FIGS. 15 and 16.

In accordance with the present disclosure, there can be provided a semiconductor memory device capable of decreasing a peak current.

While the present disclosure has been shown and described with reference to certain embodiments thereof, it will be understood by those skilled in the art that various changes in form and details may be made therein without departing from the spirit and scope of the present disclosure as defined by the appended claims and their equivalents. Therefore, the scope of the present disclosure should not be limited to the above-described embodiments but should be determined by not only the appended claims but also the equivalents thereof.

In the above-described embodiments, all steps may be selectively performed or part of the steps and may be omitted. In each embodiment, the steps are not necessarily performed in accordance with the described order and may be rearranged. The embodiments disclosed in this specification and drawings are only examples to facilitate an understanding of the present disclosure, and the present disclosure is not limited thereto. That is, it should be apparent to those skilled in the art that various modifications can be made on the basis of the technological scope of the present disclosure.

Meanwhile, the embodiments of the present disclosure have been described in the drawings and specification. Although specific terminologies are used here, those are only to explain the embodiments of the present disclosure. Therefore, the present disclosure is not restricted to the above-described embodiments and many variations are possible within the spirit and scope of the present disclosure. It should be apparent to those skilled in the art that various modifications can be made on the basis of the technological scope of the present disclosure in addition to the embodiments disclosed herein.

What is claimed is:
1. A semiconductor memory device comprising:
a memory cell configured to store data;
at least one page buffer connected to the memory cell through a bit line, to store data in the memory cell or read data from the memory cell; and
at least one cache latch connected to the at least one page buffer through a bus node,
wherein, when bit data transmission operation between the at least one page buffer and the at least one cache latch is performed, the page buffer discharges the bus node and then starts the bit data transmission operation, wherein the page buffer includes:
a main latch;
a latch transistor having a gate terminal connected to the main latch;
a first transmission transistor connected between the latch transistor and a first node;
a second transmission transistor connected between the first transmission transistor and the bus node; and
a bus node discharge transistor connected between the bus node and a voltage denoting a logic value 0.

2. The semiconductor memory device of claim 1, further comprising a third transmission transistor connected between the bus node and the at least one cache latch.

3. The semiconductor memory device of claim 2, wherein, when bit data is transmitted from the main latch to the cache latch, the page buffer:
initializes a voltage of the bus node to a voltage denoting a logic value of 0 by turning on the bus node discharge transistor; and
changes a bit data value stored in the cache latch, based on bit data stored in the main latch by turning on the first to third transmission transistors.

4. The semiconductor memory device of claim 3, wherein the first node is initialized to a power voltage,
wherein the power voltage is applied to a gate terminal of each of the first to third transmission transistors.

5. The semiconductor memory device of claim 4, wherein, when the bit data stored in the main latch is a logic value of 1, a voltage value of the bus node is maintained as a logic value of 0 after the first and second transmission transistors are turned on.

6. The semiconductor memory device of claim 5, wherein bit data stored in the cache latch is initialized to a logic value of 0,
wherein the bit data stored in the cache latch is changed from initially a logic value of 0 to a logic value of 1 after the third transmission transistor is turned on.

7. The semiconductor memory device of claim 4, wherein the page buffer further includes:
first and second precharge transistors connected between the first node and the power voltage; and
a third precharge transistor connected between the power voltage and a second node between the first and second precharge transistors,
wherein a gate terminal of the second precharge transistor is connected to the main latch,
wherein, when the bit data stored in the main latch is a logic value of 0, the first node is precharged to the power voltage by turning on the first and second precharge transistors,
wherein the voltage value of the bus node is increased by a value corresponding to the difference between the power voltage and a threshold voltage value of the second transmission transistor, after the first and second transmission transistors are turned on.

8. The semiconductor memory device of claim 7, wherein the bit data stored in the cache latch is initialized to a logic value of 0,
wherein the bit data stored in the cache latch maintains initially a logic value of 0 after the third transmission transistor is turned on.

9. The semiconductor memory device of claim 2, wherein the page buffer further includes:
first and second precharge transistors connected between the first node and a power voltage; and
a third precharge transistor connected between the power voltage and a second node between the first and second precharge transistors,
wherein a gate terminal of the second precharge transistor is connected to the main latch.

10. The semiconductor memory device of claim 9, wherein, when bit data is transmitted from the cache latch to the main latch, the page buffer:
initializes the voltage of the bus node to a logic value of 0 by turning on the bus node discharge transistor;
precharges the first node by turning on the first and third precharge transistors;
adjusts a voltage value of the first node by turning on the third transmission transistor and the second transmission transistor; and
stores data in the main latch, based on the voltage value of the first node.

11. The semiconductor memory device of claim 10, wherein, when the bit data stored in the cache latch is a logic value of 1,
the voltage of the bus node maintains a logic value of 0 after the third transmission transistor is turned on, and
the voltage value of the first node is changed to a logic value of 0 after the second transmission transistor is turned on.

12. The semiconductor memory device of claim 11, wherein the bit data stored in the main latch is initialized to a logic value of 1,
wherein the bit data stored in the main latch is maintained as initially a logic value of 1, based on the voltage of the first node, which is changed to a logic value of 0.

13. The semiconductor memory device of claim 10, wherein, when the bit data stored in the cache latch is a logic value of 0, the voltage value of the bus node is increased by a value corresponding to the difference between the power voltage and a threshold voltage value of the third transmission transistor, after the third transmission transistor is turned on,
wherein the voltage value of the first node maintains the power voltage after the second transmission transistor is turned on.

14. The semiconductor memory device of claim 13, wherein the bit data stored in the main latch is initialized to a logic value of 1,
wherein the bit data stored in the main latch is changed from initially a logic value of 1 to a logic value of 0, based on the voltage value of the first node, which is maintained as the power voltage.

15. A semiconductor memory device comprising:
a page buffer including a main latch; and
a cache latch connected to the page buffer through a bus node,
wherein, when bit data transmission operation between the main latch and the cache latch is performed, the page buffer discharges the bus node to a voltage denoting a logic value of 0 and then starts the bit data transmission operation,
wherein the page buffer includes:
a main latch;
a latch transistor having a gate terminal connected to the main latch;
a first transmission transistor connected between the latch transistor and a first node;
a second transmission transistor connected between the first transmission transistor and the bus node; and
a bus node discharge transistor connected between the bus node and a ground.

16. The semiconductor memory device of claim 15, further comprising a third transmission transistor connected between the bus node and the cache latch.

17. The semiconductor memory device of claim 16, wherein the page buffer further includes:
   first and second precharge transistors connected between the first node and a power voltage; and
   a third precharge transistor connected between the power voltage and a second node between the first and second precharge transistors.

18. The semiconductor memory device of claim 16, wherein the page buffer further includes:
   a first precharge transistor connected between the first node and a power voltage.

* * * * *